(12) United States Patent
Modi et al.

(10) Patent No.: US 11,695,539 B1
(45) Date of Patent: Jul. 4, 2023

(54) NETWORK PHYSICAL LAYER TRANSCEIVER WITH SINGLE EVENT EFFECT DETECTION AND RESPONSE

(71) Applicant: Texas Instruments Incorporated, Dallas, TX (US)

(72) Inventors: Geet Govind Modi, Cupertino, CA (US); Sumantra Seth, Bangalore (IN); Vikram Sharma, Bangalore (IN); Shankar Ramakrishnan, Bangalore (IN); Raghu Ganesan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/587,241

(22) Filed: Jan. 28, 2022

(51) Int. Cl.
| | |
|---|---|
| *H04B 1/38* | (2015.01) |
| *H04L 5/16* | (2006.01) |
| *H04L 7/033* | (2006.01) |
| *H04L 7/06* | (2006.01) |
| *H04L 7/00* | (2006.01) |
| *H03K 19/173* | (2006.01) |
| *H04L 7/04* | (2006.01) |
| *H03K 19/17784* | (2020.01) |

(52) U.S. Cl.
CPC ......... *H04L 7/033* (2013.01); *H03K 19/1737* (2013.01); *H03K 19/17784* (2013.01); *H04L 7/0079* (2013.01); *H04L 7/0091* (2013.01); *H04L 7/048* (2013.01); *H04L 7/065* (2013.01)

(58) Field of Classification Search
CPC ....... H04L 7/033; H04L 7/065; H04L 7/0079; H04L 7/048; H04L 7/0091; H03K 19/1737; H03K 19/17784; H03G 3/3078

USPC .......... 375/219, 220, 222, 373–376
See application file for complete search history.

(56) References Cited

U.S. PATENT DOCUMENTS 7,151,759 B1 * 12/2006 Ryan .................... H03G 3/3078
370/335

OTHER PUBLICATIONS

"DP83561-SP Radiation-Hardness-Assured (RHA), 10/100/1000 Ethernet PHY Transceiver with SEFI Handling Sub-System," Datasheet SNLS610B (Texas Instruments Incorporated, Nov. 2021).

(Continued)

*Primary Examiner* — Phuong Phu
(74) *Attorney, Agent, or Firm* — Valerie M. Davis; Frank D. Cimino

(57) ABSTRACT

A physical layer transceiver and a network node including the transceiver. The transceiver includes a media independent interface, a converter circuit block comprising circuitry configured to convert digital signals to analog signals for transmission over a network communications medium and convert analog signals received over the medium to digital signals, and one or more processing blocks configured to process digital data communicated between the media independent interface and the converter circuit block according to a network protocol. Management and control circuitry including power management circuitry and reset circuitry are provided. The transceiver further includes at least one single event effect (SEE) monitor, such as an ambience monitor, a configuration register monitor, a state machine monitor, or a phase locked loop (PLL) lock monitor, configured to detect and respond to an SEE event in the transceiver.

25 Claims, 9 Drawing Sheets

(56) References Cited

OTHER PUBLICATIONS

Khan et al., "A novel PLL lock and out-of-lock detect scheme based on a feedback sampling of PLL," 2014 9th Int'l Symp. on Comm. Sys., Networks & Digital Sign (CSNDSP) (IEEE, 2014), pp. 919-922.

Choi et al., "An adaptive bandwidth phase locked loop with locking status indicator," Proc. of the 9th Russian-Korean Int'l Symp. on Sci. and Tech. (IEEE, 2005), pp. 826-829.

Sayil et al., "Single-Event Coupling Soft Errors in Nanoscale CMOS Circuits," IEEE Design & Test, vol. 30, Issue 6 (IEEE, 2013), pp. 89-97.

\* cited by examiner

NETWORK PHYSICAL LAYER TRANSCEIVER WITH SINGLE EVENT EFFECT DETECTION AND RESPONSE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

This relates to network data communications equipment, and more specifically relates to physical layer transceivers.

In the field of network communications, a common reference model used to describe the architecture of a communications protocol is the Open Systems Interconnection (OSI) layered reference model. This reference model includes a stack of abstraction layers, the "lowest" of which is commonly referred as the physical layer, or "PHY." The OSI physical layer defines the electrical, timing, and other interfaces over which data bits are communicated over the communications link, whether wired (e.g., Ethernet) or wireless (e.g., cellular telephony, wireless local area network or WiFi). Communication elements such as electrical signals, signaling speeds, media and connector types, and network topologies are included within the PHY abstraction layer.

From a hardware standpoint, the term "PHY" refers to an electronic circuit, usually implemented as an integrated circuit, that implements the physical layer functions of the OSI model in a network interface controller or other network node. For example, a "PHY" is often used to refer to the transceiver circuitry in a network node that transmits and receives signals to and from another network node. Within the network node, a PHY connects a link layer device (often referred to as the "MAC" as an acronym for medium access control) to a physical medium such as an optical fiber or copper cable. A PHY device typically includes both physical coding sublayer (PCS) and physical medium dependent (PMD) layer functionality.

In the Ethernet context, a PHY can refer to a physical layer transceiver device for sending and receiving Ethernet frames, implementing the Ethernet physical layer portion of the 1000BASE-T (1000 Mbps), 100BASE-TX (100 Mbps over copper), and 10BASE-T (10 Mbps) standards according to the network as implemented. In these implementations, the Ethernet PHY provides analog signal physical access to the link and, because the PHY generally does not handle MAC addressing, interfaces with a media-independent interface (MII) to a MAC chip in a microcontroller or another system executing higher layer functions.

In many network interface card (NIC) implementations, the Ethernet PHY is realized as an integrated circuit that implements the hardware send and receive functions of Ethernet frames and interfacing between the Ethernet analog domain and the digital domain of the link-layer packet signaling. The NIC may integrate the PHY, MAC, and other functionality into a single integrated circuit, or alternatively as separate integrated circuits. Examples of modern Ethernet transceivers include the DP838xx family of devices available from Texas instruments Incorporated.

As integrated circuit features have become smaller over the years, modern integrated circuits have become sensitive to functional failures caused by impingement of high energy ions or atomic-scale particles on the integrated circuit. A functional failure in the integrated circuit due to this may result from impingement of even a single particle on the device. The effect of these ions and particles on the integrated circuit are referred to generically as "Single Event Effects," or "SEEs", reflecting the random and aperiodic nature of the underlying mechanism. Many errors due to SEEs are transient or "soft," but in some cases the effects of the event may be catastrophic functional failure or permanent damage of the device. For example, one type of "soft", or non-destructive, SEE is referred to as a Single Event Upset (SEU), referring to a "bitflip" (change of state) in a memory, register, or other digital function and signal path. Another type of soft SEE is the Single Event Transient (SET), which appears as a transient pulse on an analog signal path. SEEs also include "hard" errors that can be potentially destructive to the device. One example of such a "hard" SEE is known as Single Event Latchup (SEL), which can result in an operating current beyond device specifications (thereby necessitating a power-off reset for recovery or, at worst, permanently damaging the device). Other types of "hard" SEE errors include the burnout of power MOSFETS, gate rupture of MOS transistors and capacitors, frozen bits, and excessive noise.

Another type of SEE that can appear in functional logic circuitry is referred to as a Single Event Functional Interrupt (SEFI). For example, an ion strike may cause the logic circuitry to enter a different operating state, which may include an "off" state or possibly an invalid state. A SEFI in which a control or configuration register bit is flipped can change the configuration of the device. Also, a SEFI at a reset circuit can cause an inadvertent reset of the logic circuitry.

Vulnerability of integrated circuits to SEEs is heightened in integrated circuits deployed in the space environment, due to the enhanced presence of cosmic rays and high energy protons in that environment. Cosmic rays may be galactic or solar in origin, and often include a heavy ion component that has been observed to cause SEEs by direct ionization. This mechanism occurs from an ion particle depositing sufficient charge as it passes into the integrated circuit to cause a memory bit flip or an electrical transient. High energy protons trapped in the earth's radiation belts or emanating from solar flares may also cause direct ionization SEEs in very sensitive devices. Another SEE mechanism is indirect ionization caused by a nuclear reaction from a high energy proton occurring near a sensitive device area in the device.

In many cases, the effect of an SEE occurring in a complex integrated circuit such as an Ethernet PHY may be evident only by a complete functional failure of the device, for example if the SEE causes entry into an invalid or undesired operating mode, state, or condition, or in the worst case, causes the device to draw excessive power supply current from latchup or similar condition.

It is within this context that the embodiments described herein arise.

BRIEF SUMMARY

According to one aspect, a physical layer transceiver includes a media independent interface, a digital-to-analog circuit block comprising circuitry configured to convert digital signals to analog signals for transmission over a network communications medium and convert analog signals received over the medium to digital signals, and one or more processing blocks configured to process digital data communicated between the media independent interface and the digital-to-analog circuit block according to a network protocol. Management and control circuitry including power management circuitry and reset circuitry are provided. The transceiver further includes at least one single event effect (SEE) monitor configured to detect and respond to an SEE event in the transceiver.

According to an aspect, the at least one SEE monitor includes an ambience monitor that samples one or more of a power supply voltage and a power supply current, digitizes that sampled voltage or current, and determines whether the digitized value differs from prior history for that parameter by more than a threshold and if so, issues a reset signal.

According to an aspect, the at least one SEE monitor includes a register monitor coupled to a configuration register in a processing block. The register monitor includes error correcting code (ECC) circuitry configured to read and decode a code word from the configuration register, according to an ECC code, to determine if any bits of the code word are in error. In an example, the ECC circuitry can correct an errored bit and reload the corrected code word into the configuration register.

According to an aspect, the at least one SEE monitor includes a state machine monitor coupled to sequential logic corresponding to a state machine corresponding to a state machine having one or more states and one or more state variables. A state register stores a state code based on a one-hot encoding of the values of the state variables in the current state. The state machine monitor is configured to determine whether state transitions of the state machine are valid, or whether the state code as stored is valid. If not, the state machine monitor can issue a reset signal.

According to an aspect, the at least one SEE monitor includes a phase-locked loop (PLL) lock monitor circuit for monitoring loss of phase lock of a PLL or other timing circuitry. Register updates at a data interface of the PHY device can be disabled in response to the out-of-lock condition.

According to an aspect, the transceiver according to these aspects is incorporated into a network node that further includes a network node processor, a media access control coupled to the transceiver and the network node processor, and an interface between the transceiver and a network communications processor.

Technical advantages enabled by one or more of these aspects include an improved ability to detect SEE events in both the data path and the control path of a physical layer transceiver, and to respond to those SEE events within the transceiver. Catastrophic functional failure and, in the worst case, permanent damage to the transceiver, may thus be avoided. Implementations of these aspects can be especially beneficial in the space environment, in which the likelihood of an SEE is especially great.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION

The one or more embodiments described in this specification are implemented into a physical layer transceiver device in an Ethernet-type network such as may be deployed in a space environment, as it is contemplated that such implementation is particularly advantageous in that context. However, it is also contemplated that aspects of these embodiments may be beneficially applied in other applications, for example communications hardware for other types of networks, and in other environments in which the devices may be vulnerable to particle-induced functional errors or failures. Accordingly, it is to be understood that the following description is provided by way of example only and is not intended to limit the true scope of this invention as claimed.

Figure 1:
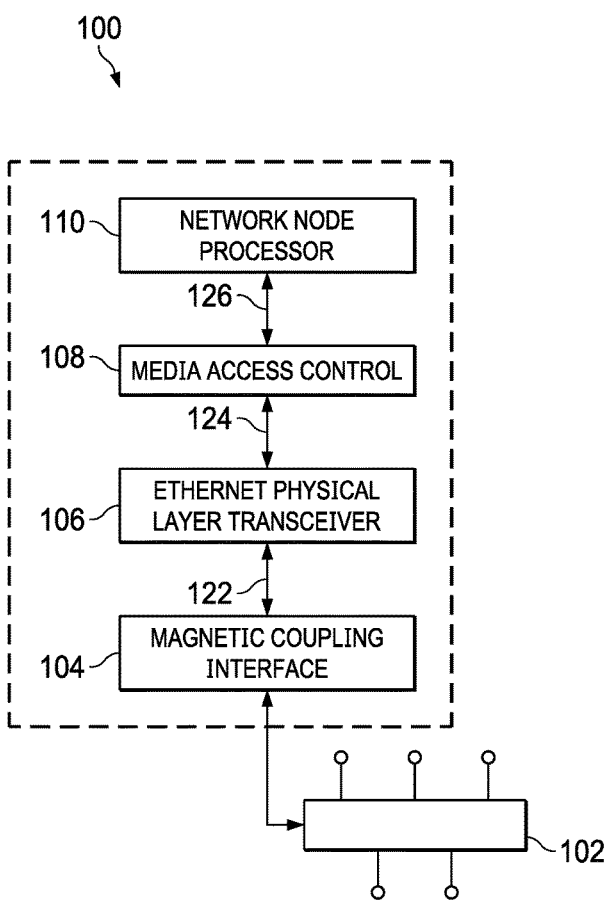
FIG. 1 is an electrical diagram, in block form, of a network node constructed according to example embodiments.

FIG. 1 illustrates an example of network node 100 into which embodiments may be implemented. Network node 100 may be realized as any one of a number of network functions, such as a computing device in the role of either or both a network server or client, a peripheral device such as a printer or other input/output function, a sensor or controller (e.g., in an Internet of Things, or IOT, context), a router, a switch, or another network function. Network node 100 is coupled to network communications medium 102 by way of which it receives and transmits data and control information. In this particular example in which the network communications are carried out over an Ethernet network, network communications medium 102 is implemented as CAT6 copper wiring or the like. In other implementations, network communications medium 102 may be realized as optical fiber or the like.

In the example of FIG. 1, network node 100 includes Ethernet physical layer transceiver (PHY) 106 constructed according to an embodiment. For the example in which network communications medium 102 is a hard-wired Ethernet connection, PHY 106 is coupled to medium 102 by magnetic coupling interface 104. Magnetic coupling interface 104 is provided to galvanically isolate medium 102 from PHY 106 while providing a signal path. For example, magnetic coupling interface 104 may be realized as a discrete Ethernet magnetics module disposed in the signal path between PHY 106 with a connector jack to physically couple to network communications medium 102. Alternatively, magnetic coupling interface 104 may be integrated into the same housing or package as an Ethernet connector jack. In either case, interface 122 between PHY 106 and magnetic coupling interface 104 in this implementation is referred to in the Ethernet context as a Media Dependent Interface (MDI), in that its specifications depend on the particular medium used for network communications medium 102.

Ethernet PHY 106, in this example embodiment, includes the appropriate circuitry for sending and receiving data and control information between upstream functions and network communications medium 102. In the Ethernet context, PHY 106 receives digital data in the form of Ethernet frames from Media Access Controller (MAC) 108 and generates analog signals corresponding to those frames for transmission over medium 102. In its receive function, PHY 106 processes analog signals received over medium 102, and for those signals representative of data intended for network node 100, digitizes and formats digital data into Ethernet frames for consumption and processing by MAC 108 and functions further upstream. As such, PHY 106 serves as the interface between the Ethernet analog domain at medium 102 and the digital domain of link-layer packet signaling for network node 100 as performed by MAC 108. The construction and operation of PHY 106 according to example embodiments will be described in further detail below.

According to this example embodiment, PHY 106 is coupled to MAC 108 by interface 124, which in this implementation is referred to in the Ethernet context as a Media Independent Interface (MII) or Reduced Gigabit Media Independent Interface (RGMII), in that the interface specifications are independent of the physical implementation of network communications medium 102. Media Access Controller (MAC) 108 in network node 100 includes the appropriate circuitry for processing data received from PHY 106 and to be communicated to PHY 106 for transmission. This processing may include, for example, managing frame buffering of the data in both the transmit and receive directions, packet formatting and recognition, timer functions, and other conventional operations involved in the data-link-layer, or MAC layer, portion of the OSI model. MAC 108 is typically integrated into a processor, field programmable gate array (FPGA), digital circuitry, memory, application-specific integrated circuit (ASIC), software, or a combination thereof. MAC 108 may be realized in the same integrated circuit as PHY 106 and MII interface 124, or alternatively as one or more integrated circuits separate from PHY 106.

In the example of FIG. 1, network node processor 110 is coupled to MAC 108 by way of an interface 126. Network node processor 110 provides the data processing and control capability appropriate to carry out the function of network node 100 in the network. Network node processor 110 may be realized as a microprocessor, microcontroller, FPGA, switch fabric, and/or other appropriate circuitry and/or for that function. Network node processor 110 may be realized in the same integrated circuit as MAC 108, or alternatively as one or more separate integrated circuits. In one example of the latter case, MAC 108, PHY 106, and magnetic coupling interface 104 may be realized in a network interface card (NIC) to which network node processor 110 is coupled via interface 126.

According to one or more example embodiments as will be described in connection with FIG. 2 et seq., PHY 106 is constructed and operates to include one or more mechanisms for monitoring and responding to errors in both the control and data paths due to SEEs. Accordingly, PHY 106 may be beneficial when implemented in communications equipment deployed into space environments, such as in satellites, space vehicles, and the like.

Figure 2:
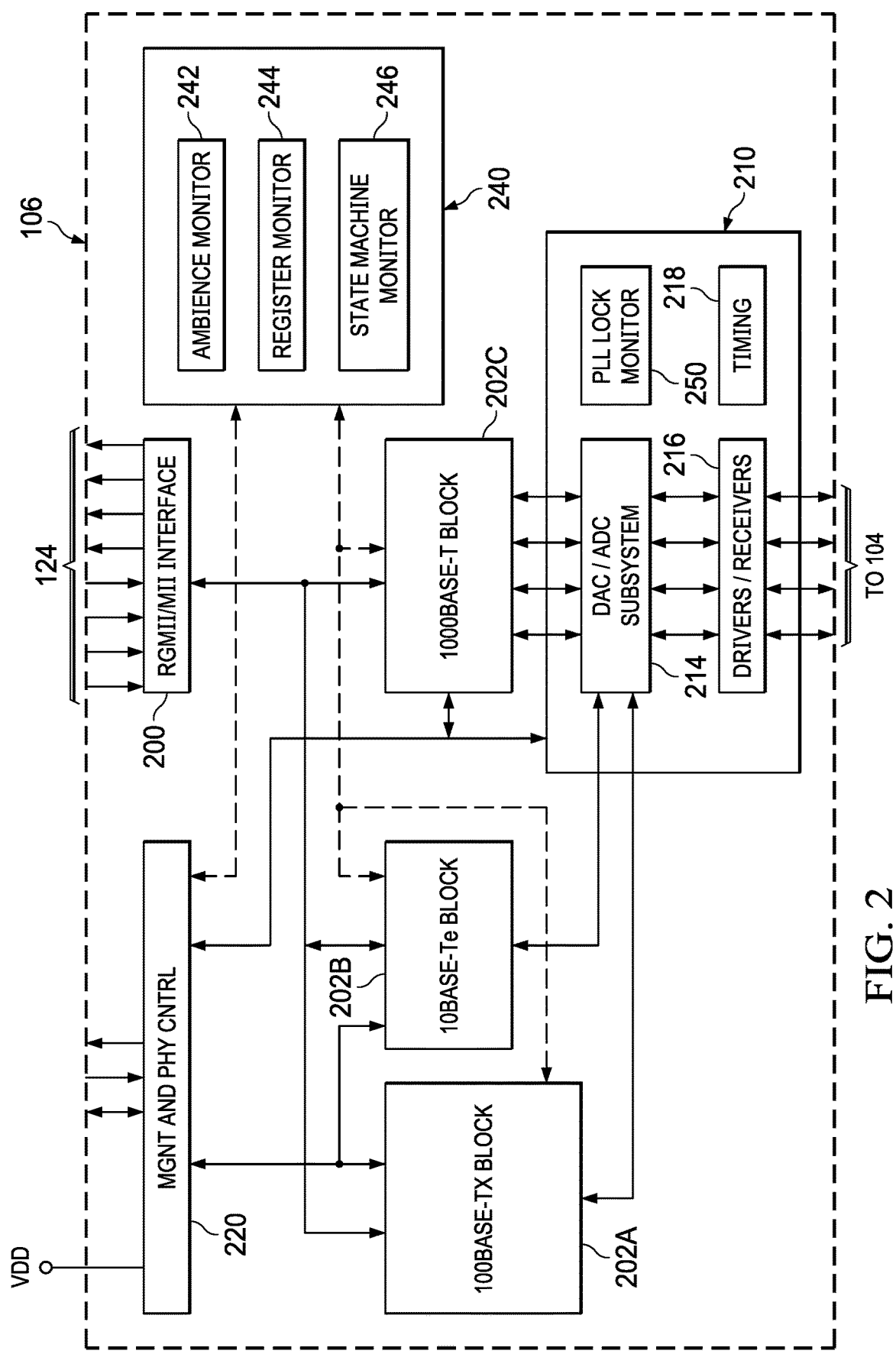
FIG. 2 is an electrical diagram, in block form, of a physical layer transceiver (PHY) constructed according to an example embodiment.

FIG. 2 illustrates an architecture of PHY 106 according to an example embodiment. As mentioned above, PHY 106 has an overall function of interfacing communications between the Ethernet analog domain at network communications medium 102 and the digital domain of link-layer packet signaling for network node 100 as performed by MAC 108. As such, PHY 106 in this example includes MII interface circuitry 200 by way of which digital signals processed or to be processed by PHY 106 are communicated to and received from MAC 108, respectively, over interface 124, according to the appropriate RGMII or MII protocol, as the case may be.

For the processing of the digital data to be communicated to and as received from MAC 108, PHY 106 includes one or more communications processing blocks 202 (including, for example, processing blocks 202A, 202B, 202C). In this example in which PHY 106 is operable to process communications according to any of three Ethernet protocols, PHY 106 includes 100BASE-TX processing block 202A, 10BASE-Te processing block 202B, and 1000BASE-T processing block 202C. Each block 202 is coupled on one side to MII interface circuitry 200 and is coupled on another side to converter block 210 for communication with network communications medium 102 via magnetic coupling interface 104. Each of processing blocks 202A, 202B, 202C includes digital logic circuitry (or other circuitry, memory and/or software) configured and operable to process digital data as appropriate for the particular protocols involved. For example, the digital logic circuitry included in processing blocks 202A, 202B, 202C may be implemented at least in part as sequential logic in the form of one or more state machines. Processing blocks 202A, 202B, 202C in this example may also include one or more configuration registers that may configure those processing blocks and PHY 106 to operate in a selected one of multiple operating modes.

In the Ethernet context of this example, the digital logic circuitry in each of processing blocks 202A, 202B, 202C is arranged to implement one or more sublayers in the applicable Ethernet protocol. In this example, 100BASE-TX processing block 202A implements the Physical Coding Sublayer (PCS), Physical Medium Attachment (PMA) sublayer, and the Physical Medium Dependent (PMD) sublayer (in order from the MII side to the Ethernet medium side). Similarly, 10BASE-Te block 202B and 1000BASE-T block 202C implement the PCS and PMA sublayers, but in this example do not require a PMD sublayer for Ethernet communications over copper-wired medium 102. As evident in FIG. 2, each of 100BASE-TX block 202A, 10BASE-Te block 202B, and 1000BASE-T block 202C is coupled to converter block 210.

In this implementation, converter block 210 is configured and operable to convert signals between the digital domain of 100BASE-TX block 202A, 10BASE-Te block 202B, and 1000BASE-T block 202C and the analog domain (e.g., as used by network communications medium 102). As such, converter block 210 includes digital-to-analog and analog-to-digital (DAC/ADC) subsystem 214, which is coupled to each of processing blocks 202A, 202B, 202C. DAC/ADC subsystem 214 is also coupled to driver/receiver circuitry 216, which in turn is coupled to network communications medium 102 via magnetics coupling interface 104. For the receipt of signals from network communications medium 102, driver/receiver circuitry 216 includes the appropriate analog filters, level shifters, and other circuitry appropriate for communicating the received analog signals (e.g., in the form of differential signals) to ADC (analog-to-digital) circuitry in DAC/ADC subsystem 214, which in turn converts the processed received analog signals into digital symbols for communication to the appropriate processing block 202 under the operative protocol. For the transmission of digital data to network communications medium 102, DAC/ADC subsystem 214 includes DAC (digital-to-analog) circuitry to convert digital symbols into analog signals (e.g., differential signals) that are then driven by the appropriate driver circuitry included in driver/receiver circuitry 216 for application to magnetic coupling interface 104. Converter block 210 includes timing circuitry 218, constructed and operable to provide the appropriate clock signals to DAC/ADC subsystem 214 for the conversion operation. Timing circuitry 218 may generate these clocks based on a received master clock signal (e.g., from a crystal oscillator or bulk acoustic wave device external to PHY 106), or a master clock signal generated within PHY 106.

Certain additional functions are also provided in PHY 106 according to this example embodiment. As shown in FIG. 2, PHY 106 includes management and control circuitry 220 constructed and operable to execute the appropriate operations for control of PHY 106 as an integrated circuit device. For example, management and control circuitry 220 includes reset circuitry for executing a hardware reset of PHY 106, for example in response to an external reset signal. Management and control circuitry 220 may also include circuitry for generating an interrupt signal communicated to a processor elsewhere in network node 100 and may include circuitry for receiving and communicating status and control information from and to external circuitry. Management and control circuitry 220 may further include power management circuitry for receiving one or more power supply voltages, one example of which is the VDD power supply voltage received at terminal VDD shown in FIG. 2, and for generating bias and reference voltages from those power supply voltages for distribution throughout PHY 106. Other functions not shown in FIG. 2 may also be provided in PHY 106, such functions including a "wake on LAN" circuit function, an auto-negotiation circuit function, and the like.

According to this example embodiment, PHY 106 includes monitoring and detection circuitry 240 configured and operable to monitor circuitry within PHY 106 to detect SEEs, SEUs, and SEFIs as may result from the impingement of heavy ions and high energy protons on the integrated circuit that incorporates PHY 106. As shown in FIG. 2, monitoring and detection circuitry 240 includes ambience monitor 242, register monitor 244, and state machine monitor 246. As indicated in FIG. 2, monitoring and detection circuitry 240 is coupled to each of processing blocks 202A, 202B, 202C, and also to management and PHY control circuitry 220 as appropriate. More specifically, one or more of ambience monitor 242, register monitor 244, and state machine monitor 246 is coupled to processing blocks 202 and management and PHY control circuitry 220, depending on the particular function or operation being monitored. The construction and operation of each of ambience monitor 242, register monitor 244, and state machine monitor 246 will be described in further detail below.

Also in this example embodiment, phase locked loop (PLL) lock monitor 250 is separately implemented as part of converter block 210, for monitoring timing upset in DAC/ADC subsystem 214. The construction and operation of PLL lock monitor 250 will also be described in further detail below.

Figure 3:
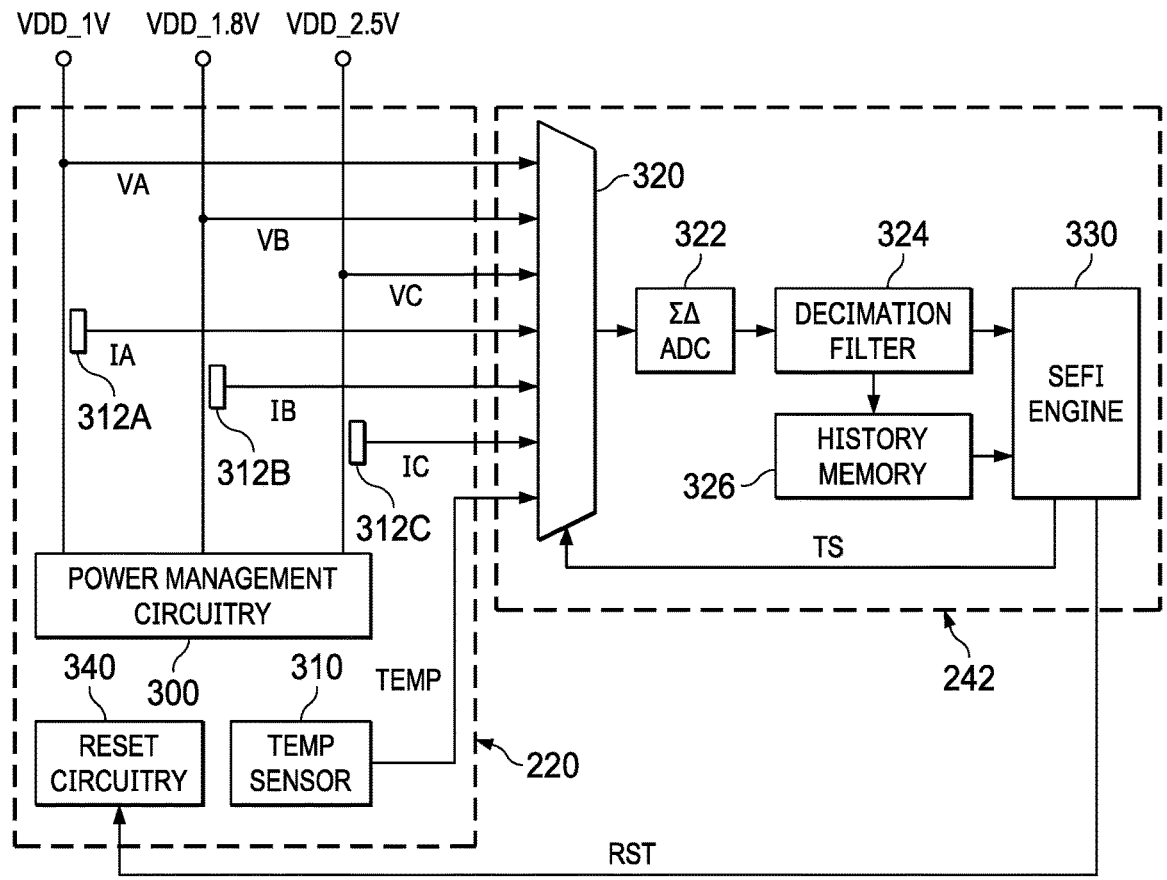
FIG. 3 is an electrical diagram, in block form, of an ambience monitor in combination with management and PHY control circuitry in the PHY of FIG. 2 according to an example embodiment.

Referring to FIG. 3, the construction and operation of ambience monitor 242, as implemented into PHY 106 according to an example embodiment, will be described. In this implementation, ambience monitor 242 monitors operating conditions at the power supplies to PHY 106, and also other ambient conditions such as the operating temperature of the integrated circuit that includes PHY 106. By monitoring these conditions of PHY 106, ambience monitor 242 can detect SEFI events that may be otherwise undetectable by other SEE detection techniques.

In connection with its monitoring of power supply operating conditions, ambience monitor 242 is coupled to power management circuitry 300 in management and PHY control circuitry 220. In this example, power management circuitry 300 includes the appropriate circuitry and/or software to manage the distribution of power (e.g., supply voltages and/or supply currents) through PHY 106, and in that regard may include voltage regulation and reference voltage generation circuits to generate other internal voltages as appropriate. PHY 106 may utilize multiple power supply voltages to serve as the VDD power supply for various circuit blocks. For example, as shown in FIG. 3, power management circuitry 300 is coupled to terminals VDD_1V, VDD_1.8V, and VDD_2.5V, for receiving power supply voltages at nominal voltages of 1.0 V, 1.8V, and 2.5 V, respectively. The voltages at terminals VDD_1V, VDD_1.8V, and VDD_2.5V are coupled to ambience monitor 242 via lines VA, VB, VC, respectively. In addition, current sensors 312A, 312B, 312C are provided in power management circuitry 300, for sensing the supply current drawn by PHY 106 from power supply terminals VDD_1V, VDD_1.8V, and VDD_2.5V, respectively. Current sensors 312 may be implemented in the conventional manner, for example as a small resistor across which voltage is measured, an inductive or Hall effect sensor, or the like. Current sensors 312A, 312B, 312C are coupled to ambience monitor 242 via lines IA, IB, IC, respectively.

Ambience monitor 242 of PHY 106 includes circuitry configured to monitor and analyze power supply voltages and currents in order to detect possible SEFI events. In this example embodiment, multiplexer 320 in ambience monitor 242 has inputs connected to lines VA, VB, VC (corresponding to the voltages at terminals VDD_1V, VDD_1.8V, and VDD_2.5V, respectively) and to lines IA, IB, IC (corresponding to the supply currents drawn by PHY 106 from terminals VDD_1V, VDD_1.8V, and VDD_2.5V, respectively). Select signal TS from control circuitry within ambience monitor 242, for example from SEFI engine 330 as shown in FIG. 3 or from elsewhere in PHY 106, operates to select one of the inputs of multiplexer 320 to connect to its output. The output of multiplexer 320 is coupled to an input of sigma-delta ADC 322 (e.g., a 1-bit converter), which samples the monitored signal at the selected output (e.g., via oversampling), and filters and otherwise modulates the sampled signal to provide a digital value corresponding to the corresponding voltage or current. In this example embodiment, the digital output of sigma-delta ADC 322 is coupled to an input of decimation filter 324, which decimates the digital output of sigma-delta ADC 322 into fewer digital bits for efficiency. Decimation filter 324 may be realized within sigma-delta ADC 322 if desired. The decimated digitized voltage or current measurement, as the case may be, is forwarded from decimation filter 324 to history memory 326 and to SEFI engine 330. History memory 326 maintains a historical record of the parameters measured by ambience monitor 242 over time.

In this example embodiment, the operating temperature of the integrated circuit (e.g., the substrate temperature of the integrated circuit in which or on which PHY 106 is fabricated) is also monitored by ambience monitor 242. This ambient chip temperature is an additional and optional parameter monitored by ambience monitor 242; additional ambient conditions may also be monitored by ambience monitor 242 in addition to chip temperature, if desired. In this regard, management and PHY control circuitry 220 includes temperature sensor 310, which provides an analog signal corresponding to temperature on line TEMP to an additional input of multiplexer 320 in ambience monitor 242. Multiplexer 320 thus includes the signal on line TEMP as one of the inputs it connects to sigma-delta modulator 322 for digitization; decimation filter 324 similarly decimates the sampled digital value, and the decimated digitized value of the analog signal on line TEMP is also connected to history memory 326 and to SEFI engine 330 for storage and analysis, respectively.

SEFI engine 330 may be constructed as digital logic circuitry, for example dedicated logic circuitry, programmable logic circuitry executing program instructions (stored, e.g., in its memory, in local memory in ambience monitor 242, or in memory elsewhere in PHY 106, or some combination thereof) configured to carry out its functions as described by way of example in this specification. In a general sense, SEFI engine 330 operates to analyze the voltage, current, and (optionally) temperature measurements as monitored over time to detect a possible SEFI event, and in response issue a signal to the appropriate circuitry in PHY 106. In the example of FIG. 3, SEFI engine 330 generates a reset signal in response to its detection of a SEFI event and communicates that reset signal on line RST to reset circuitry 340 in management and PHY control circuitry 220.

Figure 4:
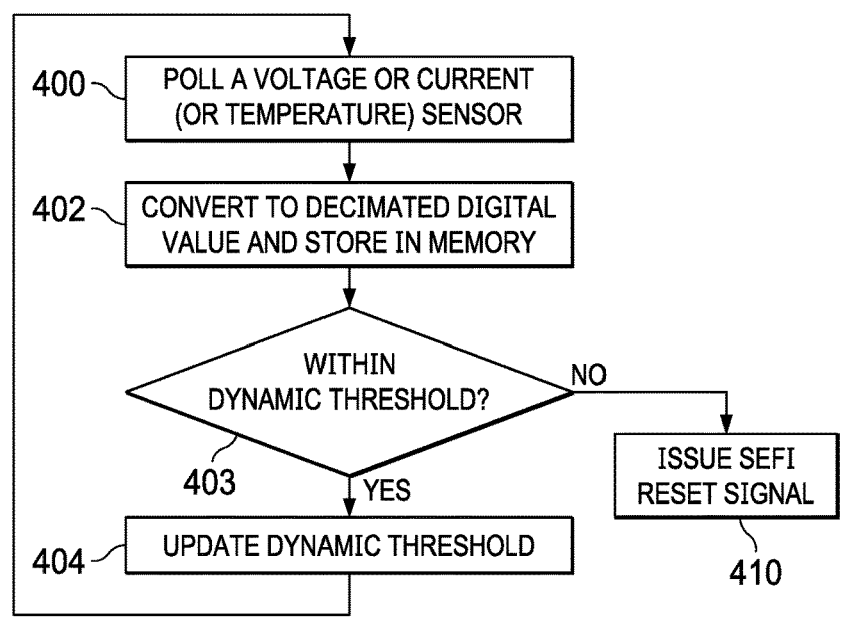
FIG. 4 is a flow diagram illustrating the operation of the ambience monitor of FIG. 3 according to an example embodiment.

FIG. 4 illustrates the operation of ambience monitor 242 of FIG. 3 according to an example embodiment. In process 400, SEFI engine 330 causes the polling of voltage, current, and (optionally) temperature measurements, for example by cycling control signal TS applied to the select input of multiplexer 320 to select one of its inputs for forwarding to sigma-delta ADC 322. In this example, polling process 400 selects one of the inputs of multiplexer 320 (e.g., one of VA, VB, VC, IA, IB, IC, TEMP) for forwarding to sigma-delta ADC 322. Alternatively, more than one of the input signals applied to multiplexer 320 may be acquired in process 400, prior to forwarding any of the signals to sigma-delta ADC 322. For this description, however, the operation of ambience monitor 242 will be described for the case in which polling process 400 acquires of one monitored parameter (e.g., voltage, supply current, or temperature) at a time for processing to determine whether its current value indicates an SEFI event.

In process 402, sigma-delta ADC 322 converts the signal acquired via multiplexer 320 in process 400 from an analog signal to a digital data word, in this example by way of 1-bit sigma-delta modulation. Also in process 402, decimation filter 324 decimates the digital data word output by sigma-delta ADC 322, and this decimated digital value is stored in history memory 326, for example in association with a timestamp indicating a current time (e.g., the time of acquisition). This decimation of the digital value by decimation filter 324 reduces the size required for history memory 326 while still providing adequate precision for SEE detection. The decimated digital value output by decimation filter 324 is also forwarded to SEFI engine 330 as shown in FIG. 3 for comparison with prior recent history for that measured parameter as will be explained below.

According to this example embodiment, ambience monitor 242 operates to detect SEFI events that affect the power supply voltage and supply currents. More specifically, it has been observed that an SEE such as those resulting from the impingement of high energy protons or heavy ions on an integrated circuit can be exhibited as an abrupt change in the current drawn from an external power supply, often as an abrupt drop in that supply current. SEEs may also be exhibited as an abrupt change in a power supply voltage, for example in conjunction with an abrupt change in supply current. In complementary metal-oxide-semiconductor (CMOS) integrated circuits, one type of SEE is initiation of latch-up (e.g., triggering of a parasitic thyristor in the CMOS structure) by the proton or heavy ion. Such latch-up is referred to as single-event latchup (SEL). The excessive current drawn in a latch-up event can be detected as a sudden increase in device temperature, which may be sensed by temperature sensor 310 and communicated to ambience monitor 242 as shown in FIG. 3. An SEE causing these abrupt changes in a power supply voltage, supply current, or device temperature may not necessarily be otherwise reflected in the operation of PHY 106 (e.g., by an SEU of a stored logic level or data state), and thus may not be detected until catastrophic functional failure of the device.

The operation of SEFI engine 330 in ambience monitor 242 according to this example embodiment considers these SEEs in its detection process. As noted above, SEFI engine 330 executes decision 403 to compare a current decimated digital value corresponding to a monitored parameter (e.g., voltage, current, temperature) with a dynamic threshold for that same parameter as previously calculated by SEFI engine 330 from previous values of that parameter over time. For purposes of SEE detection, the absolute value of the most recent measurement of power supply voltage, current, or chip temperature is of less importance (if any) than the relative value of that most recent measurement as compared with the recent history of that measured parameter. According to this example embodiment, the dynamic threshold against which the current decimated digital value of the monitored parameter may be calculated by SEFI engine 330 as a percentage, proportional, or absolute change in that value from an average value of that parameter as measured over a recent time interval. The determination of the dynamic threshold for a parameter from relatively recent history according to this implementation allows for possible differences in power consumption in different available operating modes of PHY 106. If the current, or most recent, decimated digital value of the measurement acquired in process 400 is within the dynamic threshold (e.g., does not exhibit an abrupt change relative to the stored history for that parameter), decision 403 returns a "yes" result. SEFI engine 330 then updates the dynamic threshold for that parameter of interest based on this most recent measurement, and the next monitored parameter is selected via select signal TS for acquisition and processing, beginning with process 400.

If, on the other hand, SEFI engine 330 determines that the most recent measurement acquired in process 400, and digitized and decimated in process 402, is outside of the dynamic threshold relative to recent history for that parameter (decision 403 is "no"), SEFI engine 330 has detected a possible SEE, and operates to take an appropriate action in process 410. In this example embodiment, the indicated action for a possible SEE detected by SEFI engine 330 in ambience monitor 242 is a hardware reset of PHY 106. In this example, process 410 (as performed by SEFI engine 330) includes the issuing of a reset signal on line RST to reset circuitry 340 in management and PHY control circuitry 220. Reset circuitry 340 then executes a reset of PHY 106, in an attempt to clear the effect of the SEE.

In this manner, ambience monitor 242 operates to detect possible SEFIs that appear as an abrupt change in power supply voltage at PHY 106, supply current drawn by PHY 106, and the chip operating temperature of PHY 106, and to initiate a response to those SEFIs, for example by way of resetting the device. This detection and response can thus rapidly respond to SEEs that may not be otherwise detected from the operation of digital logic in PHY 106.

Figure 5A:
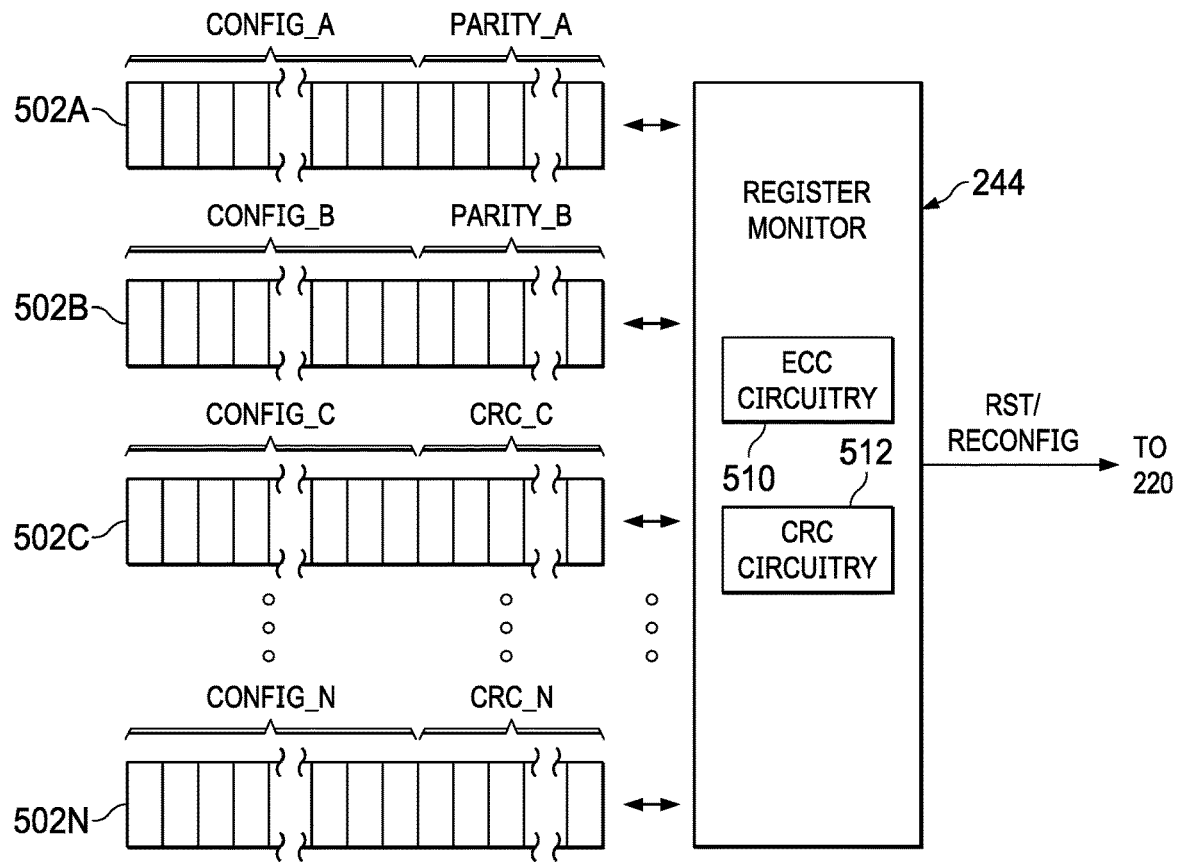
FIG. 5A is an electrical diagram, in block form, of a register monitor in the PHY of FIG. 2 according to an example embodiment.

FIG. 5A illustrates the architecture and operation of register monitor 244 as implemented into PHY 106 according to an example embodiment. In this implementation, register monitor 244 monitors the contents of various registers in the functional and other circuitry of PHY 106, to detect and in some cases correct bit errors caused by SEU events. More specifically, in one example, register monitor 244 may operate to prevent PHY 106 from entering an invalid or otherwise undesired operating mode or condition in the event of an SEU of a configuration register, as will now be described.

As shown in FIG. 5A, a number of configuration registers 502A, 502B, 502C, . . . , 502N (collectively and individually referred to as configuration registers 502) are used in Ethernet PHY 106. For example, each of processing blocks 202A, 202B, 202C may include one or more configuration registers 502. Support circuitry such as management and PHY control circuitry 220, MII interface 200, converter block 210, and the like may also include one or more configuration registers 502. Each configuration register 502 stores a digital word that can specify a particular operating mode for its functional circuitry from a set of available modes and can specify particular options for that mode from a set of available options in the selected operating mode. In some cases, configuration register 502 may further include one or more status bits, which may be readable by the appropriate control circuitry or circuitry external to PHY 106.

The bit storage locations of configuration registers 502 may be constructed as memory cells, such as used in random access memory (RAM) resources elsewhere in PHY 106. For example, bit storage locations of configuration registers 502 may be constructed as conventional static RAM cells or flip-flop latches, each storing one data bit. Alternatively, some or all of the configuration register bit storage locations, for example the most critical configuration registers or configuration bit storage locations, may be constructed as self-correcting flip-flops. Such self-correcting flip-flops can provide additional SEU tolerance in PHY 106, which may especially be important for the most critical configuration bits and registers. One example of such a self-correcting flip-flop as may be used to construct some or all of the bit storage locations of configuration registers 502 will now be described with reference to FIG. 5B.

Figure 5B:
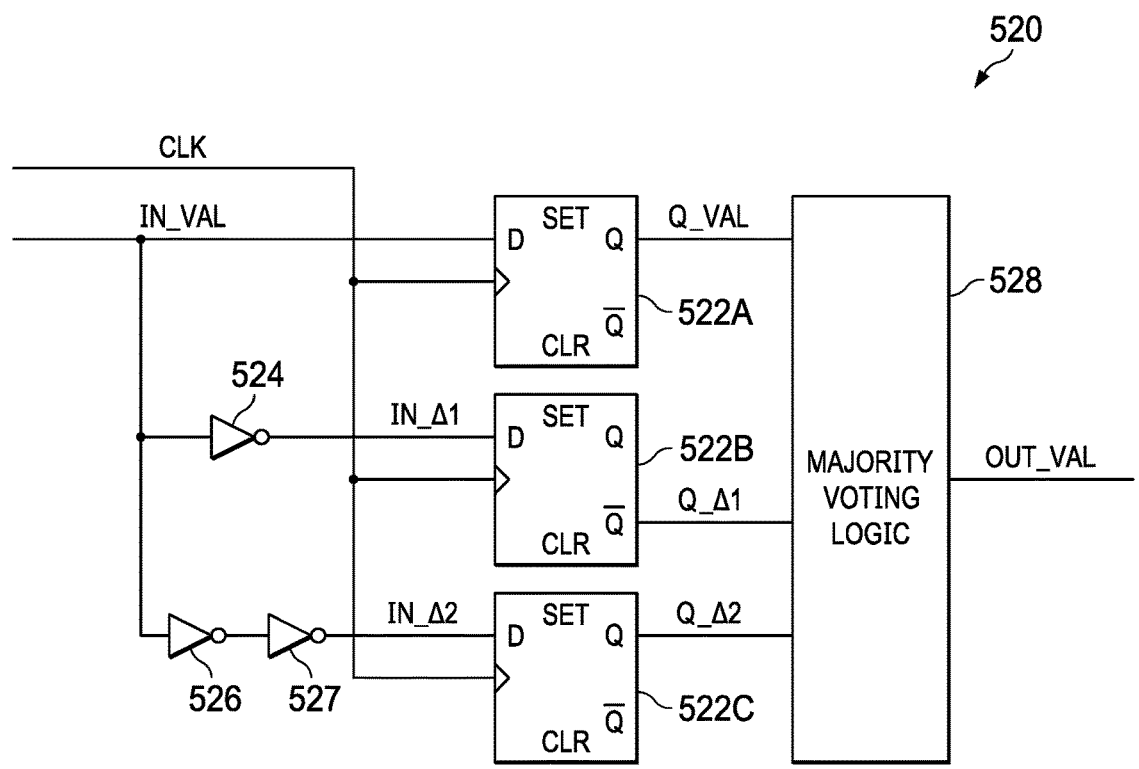
FIG. 5B is an electrical diagram, in schematic form, of a storage bit in a configuration register of FIG. 5A according to an example embodiment.

FIG. 5B illustrates an example of bit storage location 520 constructed as a self-correcting triple mode redundancy (TMR) flip-flop. In this example, bit storage location 520 includes three D-type flip-flops 522A, 522B, 522C, each clocked by a clock signal CLK. The D input of flip-flop 522A receives an input data value IN_VAL, such as may be provided by functional circuitry in PHY 106 that loads configuration information into this configuration register 502. Input data value IN_VAL is also applied to an inverter 524, which has an output presenting an output signal IN_Δ1 to the D input of flip-flop 522B. Similarly, input data value IN_VAL is applied to the input of inverter 526, which has an output coupled to the input of a second inverter 527; second inverter 527 in turn has an output applying output signal IN_Δ2 to the D input of flip-flop 522C. Accordingly, output signal IN_Δ1 received at flip-flop 522B is delayed from input data value IN_VAL by the propagation delay of inverter 524, and output signal IN_Δ2 received at flip-flop 522C is delayed from input data value IN_VAL by the two propagation delays (one for inverter 526 and another for inverter 527).

Flip-flops 522A, 522B, 522C provide output signals Q_VAL, Q_Δ1, Q_Δ2, respectively, to corresponding inputs of majority voting logic 528. In the example of FIG. 5B, output signals Q_VAL, Q_Δ2 are driven from the Q outputs of flip-flops 522A, 522C, respectively, while output signal Q_Δ1 is driven from the $\overline{Q}$ output of flip-flop 522B to account for the odd numbered inversion of input value IN_VAL by inverter 524. Majority voting logic 528 is constructed to generate an output signal OUT_VAL at a logic level corresponding to that applied at two or more of its three input signals Q_VAL, Q_Δ1, QΔ2. In other words, an SEU that has the effect of changing one of the bit value of signals Q_VAL, Q_Δ1, Q_Δ2 will not affect the output value OUT_VAL that is based on a "majority vote" of the three inputs, two of which are at the unaffected logic level. This construction of bit storage location 520 can thus provide additional SEU tolerance to PHY 106, especially in critical locations such as configuration registers 502. This additional SEU tolerance results from both the spatial separation provided by the physically separate flip-flops 522A, 522B, 522C in bit storage location 520, and the temporal separation provided by inverters 524, 526, 528 in applying input value IN_VAL to flip-flops 522A, 522B, 522C.

For purposes of this description, configuration register 502A will be considered as deployed within processing block 202A, configuration register 502B as deployed within processing block 202B, configuration register 502C as deployed within processing block 202C, and so on, and configuration register 502N will be considered as deployed in management and PHY control circuitry 220. In this example embodiment, register monitor 244 is bidirectionally coupled to each of configuration registers 502A, 502B, 502C, . . . , 502N as deployed throughout PHY 106. More specifically, register monitor 244 includes either or both error correcting code (ECC) circuitry 510 and cyclic redundancy check (CRC) circuitry 512. Each of ECC circuitry 510 and CRC circuitry 512 is capable of reading the contents of each of configuration registers 502 to detect one or more errored bits in those contents that may result from an SEE. ECC circuitry 510 is additionally capable of rewriting one or more errored bits in those contents in the event of an SEE.

In this example embodiment, a systematic error correcting code is used by ECC circuitry 510 to detect and correct errored bits in one or more of configuration registers 502. As such, each configuration register 502 to be monitored by ECC circuitry 510 includes both a configuration data portion and a parity data portion. For example, referring to FIG. 5A, configuration register 502A includes configuration data portion CONFIG_A and parity data portion PARITY_A. As conventional in ECC coding, the contents of parity data portion PARITY_A of configuration register 502A depend on the contents of its configuration data portion CONFIG_A, with that dependence determined by the particular ECC being used. Further, the number of bits contained in parity data portion PARITY_A of configuration register 502A depends on the number of bits in its configuration data portion CONFIG_A, and also on the particular ECC being used. For the example of a 7,4 Hamming ECC code, a thirty-two bit configuration data portion CONFIG_A will require a twenty-four bit parity data portion PARITY_A. Those configuration registers 502 in PHY 106 monitored by ECC circuitry 510 may all be of the same size and use the same ECC, or may be of varying size, use different ECCs, or both, depending on the particular design. Further, in this example embodiment, both of the configuration data and parity data portions of a given configuration register 502 may be physically realized at the same location of PHY 106, whether in the processing block 202 associated with that configuration register or in a separate register file (not shown) in PHY 106. Alternatively, one or more of configuration registers 502 may have its parity data portion resident within register monitor 244, if desired.

Furthermore, one or more of configuration registers 502 may utilize a non-systematic ECC coding, such that the resulting code word stored in that configuration register 502 does not have distinct configuration data and parity data portions.

Alternatively or in addition to ECC circuitry 510, register monitor 244 may include CRC circuitry 512 to perform error detection using a cyclic redundancy check for one or more of configuration registers 502. Configuration registers 502 to be monitored by CRC circuitry 512 also include both a configuration data portion and a CRC affix portion. In one example, configuration register 502C of FIG. 5A is monitored by CRC circuitry 512, and as such includes configuration data portion CONFIG_C and CRC affix portion CRC_C. As conventional in CRC coding, the contents of CRC affix portion CRC_C of configuration register 502C corresponds to an affix calculated from the application of a generator polynomial to the contents of its configuration data portion CONFIG_C. The generator polynomial and the operation applying that polynomial to the payload data are determined by the particular CRC being used. In one example, one of the CRC-8, CRC-16, and CRC-32 algorithms may be used, resulting in a CRC affix portion of eight, sixteen, and thirty-two bit sizes, respectively. Those of configuration registers 502 in PHY 106 that are monitored by CRC circuitry 512 may all be of the same size and use the same CRC, or may be of varying size, use different CRCs, or both, depending on the particular design. Further, in this example embodiment, both of the configuration data and CRC affix portions of a given configuration register 502 may be physically realized at the same location of PHY 106, whether in the processing block 202 associated with that configuration register or in a separate register file (not shown) in PHY 106. Alternatively, one or more of configuration registers 502 may have its CRC affix portion resident within register monitor 244, if desired.

As mentioned above, register monitor 244 may include both ECC circuitry 510 and CRC circuitry 512, each monitoring one or more of configuration registers 502. For example, certain configuration registers 502 may be more critical to operation of PHY 106 than others, in which case the error correction capability of ECC circuitry 510 may monitor those more critical configuration registers 502, while CRC circuitry 512 may monitor the less critical configuration registers 502. In the example implementation of FIG. 5A, configuration registers 502A, 502B may be critical configuration registers, and monitored by ECC circuitry 510 in register monitor 244, while less critical configuration registers 502C, 502N are monitored by CRC circuitry 512.

In any case, the contents of each configuration register 502 are written at configuration or reconfiguration of its associated functional circuitry. This configuration or reconfiguration may occur at power-on of PHY 106, for example by way of bootstrap code loading one or more of configuration registers 502 according to a configuration retained in non-volatile memory in PHY 106 or in memory external to PHY 106. In some implementations, configuration or reconfiguration of configuration registers 502 may be in response to user input. In any case, the writing of the contents of a configuration register 502 involves the encoding of a code word or CRC check from the configuration data itself according to the particular ECC coding or CRC being used, with that code word or affix then written into that configuration register 502. This encoding and writing may be performed by control circuitry within the functional circuitry associated with the configuration register 502, or alternatively by the applicable ECC circuitry 510 or CRC circuitry 512 in register monitor 244.

Register monitor 244 has an output coupled to reset circuitry 310 in management and PHY control circuitry 220 according to this example embodiment, by way of which register monitor 244 can issue a reset or reconfiguration signal on line RST/RECONFIG as shown in FIG. 3.

Figure 6:
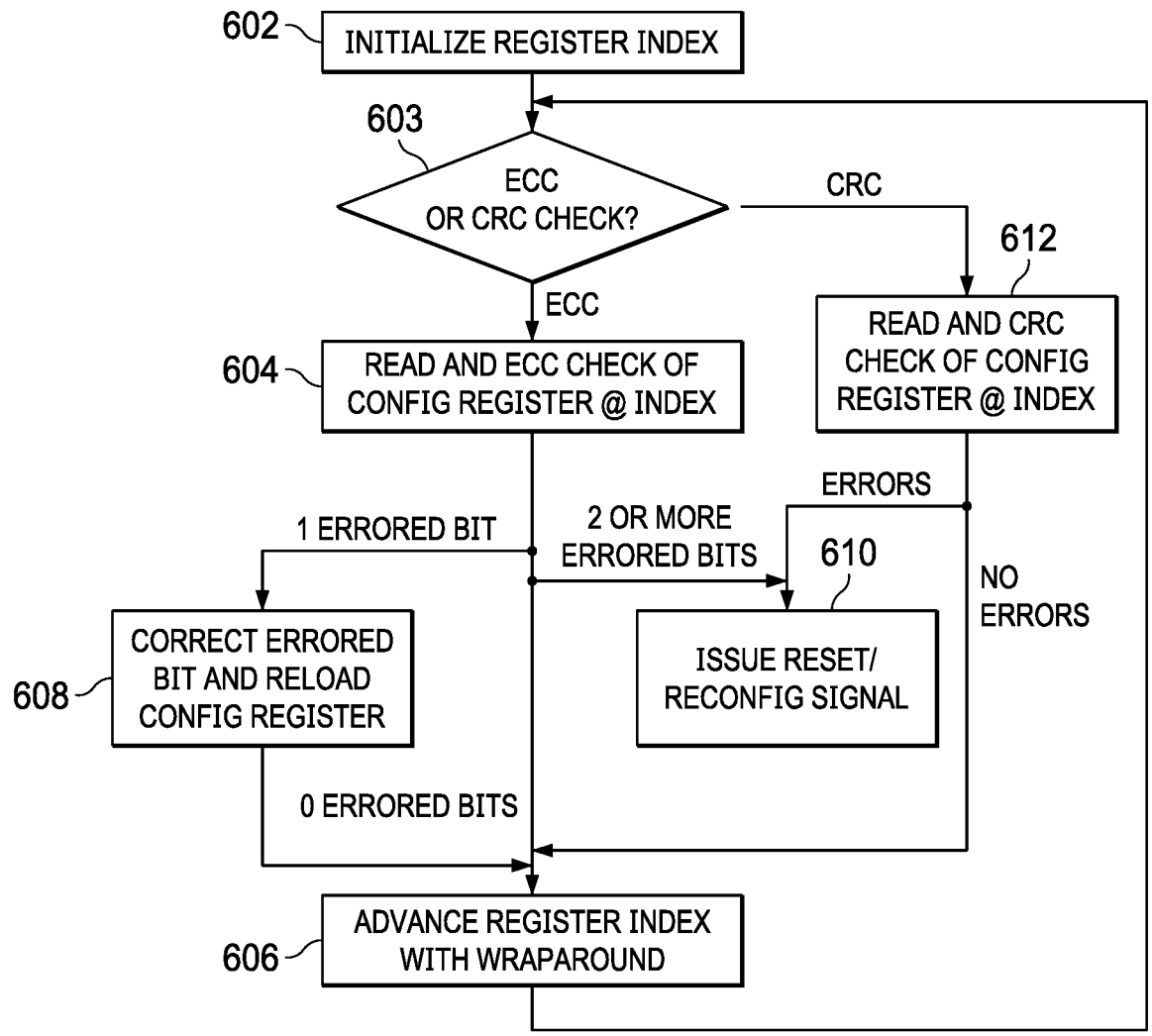
FIG. 6 is a flow diagram illustrating the operation of the ambience monitor of FIG. 5A according to an example embodiment.

Referring now to FIG. 6, the operation of register monitor 244 in detecting and responding to SEU events that affect the contents of configuration registers 502A, 502B, 502C, . . . , 502N is described in connection with an example embodiment. This operation may be executed by circuitry (e.g., logic circuitry, a processor, and/or a state machine) in register monitor 244 together with ECC circuitry 510; such logic circuitry may be implemented as custom logic, programmable logic circuitry, or a combination thereof. The operations of FIG. 6 are performed during the functional operation of PHY 106 after configuration registers 502 have been loaded or written with the desired configuration data and parity data according to the ECC coding applied by ECC circuitry 510.

According to this example embodiment, the contents of configuration registers 502 are periodically polled by register monitor 244, with the periodicity of that polling either set at a desired interval or performed repeatedly and continuously. In process 602, register monitor 244 initializes an index to select one of configuration registers 502A, 502B, 502C, . . . , 502N (e.g., configuration register 502A). In this example, ECC circuitry 510 monitors some of configuration registers (e.g., configuration registers 502A, 502B in FIG. 5A) and CRC circuitry 512 monitors others (e.g., configuration registers 502C, 502N). As such, decision 603 determines whether the configuration register selected in process 602 is monitored by ECC or CRC.

For configuration registers 502 that are monitored by ECC circuitry 510 in this example, such as configuration registers 502A and 502B, decision 603 returns an "ECC" result. In this case, ECC circuitry 510 in register monitor 244 reads and decodes the contents of the selected configuration register 502A according to the applicable ECC code in process 604 to determine whether the current contents of configuration register 502A are in error. It is useful to note that this reading and decoding of configuration register 502A in process 604 is not performed in conjunction with or in response to an operation of PHY 106 or the functional circuitry (e.g., functional block 202A) associated with that configuration register 502A, but rather is performed according to a periodic polling under the control of register monitor 244. As such, register monitor 244 in this example embodiment detects changes in the data state of one or more bits of configuration register 502A that may have resulted from an SEU. SEUs at configuration registers 502A, 502B, 502C, . . . , 502N can cause a severe functional failure of PHY 106 by unintentionally "reconfiguring" the associated functional circuitry into a different operating mode than intended, or into an invalid operating condition entirely.

The error detection performed by ECC circuitry 510 in process 604 and the response to a detected error depends on the particular ECC code used to encode and decode the configuration register contents. As known in the art, some ECC codes are able to detect one or more errored bits (and identify which bit or bits are in error) and may also be able to correct one or more of the detected errored bits. For example, the 7,4 Hamming code can detect but not correct two errored bits in the code word and can correct one errored bit. FIG. 6 illustrates the operation of register monitor 244 for the case of a 7,4 Hamming code, by way of example.

The ECC check performed by ECC circuitry 510 in process 604 can thus provide three possible results: no errored bits in configuration register 502A, one errored bit, or two or more errored bits. If analysis of the results of process 604 by register monitor 244 determines that configuration register 502A has no errored bits, register monitor 244 advances the register index to select a next one of configuration registers 502 to be monitored (e.g., configuration register 502B) in process 606, and that next configuration register 502B is read and decoded in a next instance of process 604.

If register monitor 244 determines from process 604 that a single bit of configuration register 502A is in error, in process 608 ECC circuitry 510 corrects that errored bit in the code word and writes the corrected code word into the currently selected configuration register 502A. Register monitor 244 then advances the register index in process 606, and the next configuration register 502B (for example) is ECC checked in process 604 to repeat the process. If, however, register monitor 244 determines from process 604 that two or more bits of configuration register 502A are in error, the register contents cannot be corrected using the 7,4 Hamming code. In this case, therefore, register monitor 244 executes process 610 to issue a reset or reconfiguration signal to reset circuitry 310 or such other appropriate circuitry (e.g., management and PHY control circuitry 220) of PHY 106 to initiate a reconfiguration of the affected functional circuitry, such as reconfiguration to a default condition, or initiate a reset of PHY 106 entirely.

Of course, different ECC codes have different levels of detection and correction. The number of parity or additional code bits required increases with increasing error correction and detection capability. In general, a given code will be able to correct fewer errored bits in a code word than it is able to detect. Accordingly, the example embodiment of FIG. 6 would similarly apply to such other ECC codes, providing the possible results of no error in the configuration register 502 contents, correction of a number of errored bits up to a correction limit, and initiating a reset (e.g., reset of PHY 106 or a processing block 202, or reconfiguration of configuration register 502) upon detecting a number of errored bits greater than the correction limit.

For configuration registers 502 that are monitored by CRC circuitry 512 in this example, such as configuration registers 502C and 502N, decision 603 returns a "CRC" result. In this case, CRC circuitry 512 in register monitor 244 reads and checks the contents of the selected configuration register 502 in process 612 to determine whether those contents include one or more errored bits. As noted above, CRC circuitry 512 is capable of detecting but not correcting the presence of an error in the evaluated data word, due to the nature of the CRC algorithm. Accordingly, if the CRC check in process 612 detects an error in the contents of the selected configuration register 502 (process 612 returns an "errors" result), register monitor 244 issues a reset or reconfiguration signal in process 610 to reset circuitry 310 or other appropriate circuitry (e.g., management and PHY control circuitry 220) of PHY 106 to initiate reconfiguration of the errored configuration register and the affected functional circuitry, such as reconfiguration to a default condition. In some cases, the errored configuration register 502 detected in process 612 may require initiation of a reset of PHY 106 in its entirety, in response to a reset signal issued in process 610.

By providing register monitor 244 in monitoring and detection circuitry 240 according to this example embodiment, SEEs that cause an upset in the configuration state or operating mode of functional and other circuitry in PHY 106 can be detected and addressed rapidly following the event, possibly avoiding functional failure of PHY 106.

According to this example embodiment, monitoring and detection circuitry 240 in PHY 106 of FIG. 2 further includes state machine monitor 246. As will now be described in connection with FIG. 7 and FIG. 8, state machine monitor 246 includes digital logic circuitry configured and operating to monitor the state of sequential logic functions, or state machines, in functional blocks 202A, 202B, 202C, in management and PHY control circuitry 220, and in other functions in PHY 106.

Figure 7:
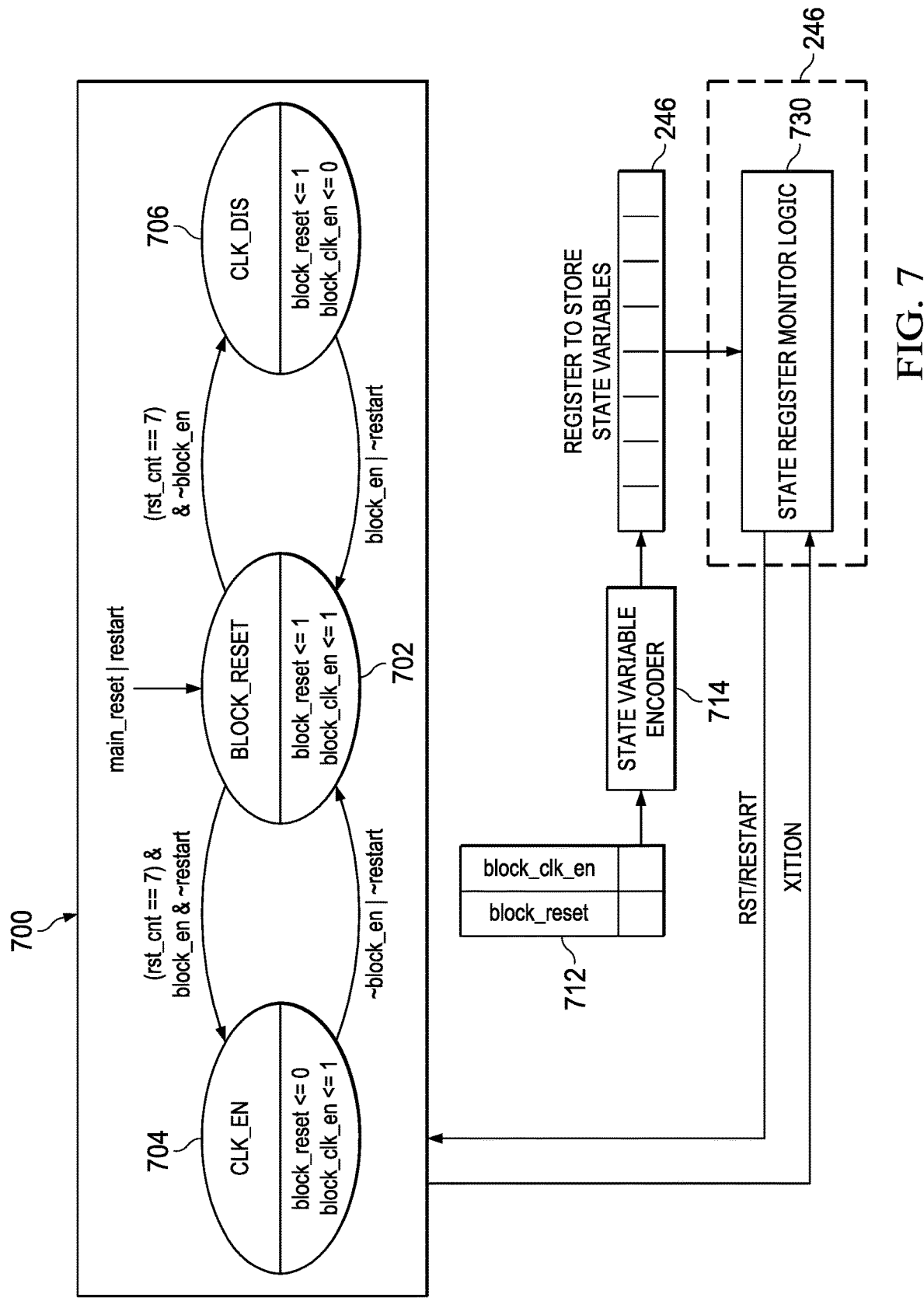
FIG. 7 is an electrical diagram, in block form, of a state machine monitor in combination with an instance of sequential logic in the PHY of FIG. 2 according to an example embodiment.

FIG. 7 illustrates an implementation of state machine monitor 246 in combination with an instance of sequential logic in PHY 106 according to an example embodiment. In this example, state machine 700 corresponds to an instance of sequential logic for reset control of a functional block in PHY 106, and as such may be deployed as part of management and PHY control circuitry 220 of PHY 106 in FIG. 2. For example, state machine 700 may be constructed from a programmable logic device, a programmable logic controller, logic gates, and flip flops or other digital storage. More specifically, one possible hardware implementation of state machine 700 may include a register for storing state variables, a block of combinational logic that determines state transitions, and a block of combinational logic that determines the output of state machine 700, which may include new values for the state variables.

As evident from FIG. 7, state machine 700 is a relatively simple sequential logic block, in that it has three valid operating states and two state variables. The three states of state machine 700 are: BLOCK_RESET state 702, CLK_EN state 704, and CLK_DIS state 706, corresponding to reset, clock enable, and clock disable conditions, respectively. The two state variables 712 of state machine 700 are: block_reset and block_clk_en. In this instance, upon a main reset of PHY 106 or a restart signal ("main_reset|restart" as shown in FIG. 7), state machine 700 enters BLOCK_RESET state 702, and sets both of state variables block_reset and block_clk_en to "1" (e.g., a logic "1" or a logic "high"). Two valid state transitions are available from BLOCK_RESET state 702.

State machine 700 may transition from BLOCK_RESET state 702 to CLK_EN state 704 in response to the logical combination of a reset count value equal to a specific value (e.g., 7), a block enable signal asserted ("block_en"), and the restart signal deasserted ("~restart"). On entry into CLK_EN state 704, state variable block_reset is reset to "0" (e.g., a logic "0" or a logic "low") and state variable block_clk_en remains set ("1"). From a functional standpoint, the CLK_EN state 704 corresponds to an active condition for its corresponding functional circuit, for example by enabling clock signals to be applied and received by that functional circuitry. Only one valid state transition from CLK_EN state 704 is available, namely a transition to BLOCK_RESET state 702 in response to the logical combination of the block enable signal deasserted ("~block_en", referring for example to the signal being reset to "0") and the restart signal asserted ("restart"). On entry into BLOCK_RESET state 702 from CLK_EN state 704, state variable block_reset is set ("1") and state variable block_clk_en remains set ("1").

The other valid transition from BLOCK_RESET state 702 is to CLK_DIS state 706, which occurs in response to the logical combination of the reset count value not equal to the specific predefined value (e.g., 7) and the block enable signal deasserted ("~block_en"). On entry into CLK_DIS state 706, state variable block_reset remains set ("1") and state variable block_clk_en is reset ("0"). From a functional standpoint, the CLK_DIS state 704 corresponds to an inactive condition for its corresponding functional circuit, for example by disabling clock signals to be applied to or received by that functional circuitry. The single valid state transition from CLK_DIS state 706 is a transition to BLOCK_RESET state 702, which is in response to the logical combination of the block enable signal asserted ("block_en") and the restart signal asserted ("restart"). Again, on entry into BLOCK_RESET state 702 from CLK_DIS state 706, state variable block_reset remains set ("1") and state variable block_clk_en is set to "1".

As noted above, the current values of state variables for a state machine may be stored in a state register associated with the corresponding state machine. For the case of state machine 700, one may construct a state table from the possible values of these two state variables 712, namely block_reset and block_clk_en, as follows:

TABLE 1

| State | State code (block_reset, block_clk_en) |
|---|---|
| [undefined] | 00 |
| BLOCK_RESET | 01 |
| CLK_EN | 10 |
| CLK_DIS | 11 |

As shown in this Table 1, one can determine the current state of state machine 700 by reading its state variables 712. If, however, the values of state variables 712, namely block_reset and block_clk_en, were encoded into a two-bit code word and stored as a state register, an SEU that flips the state of one of those two bits in the state register could place state machine 700 into a different state than the operation of PHY 106 may intend, including an undefined and thus invalid state (e.g., by flipping the single "1" bit in either of the BLOCK_RESET or CLK_EN states). In this arrangement, PHY 106 would be vulnerable to a catastrophic malfunction in the event of an SEU to one of configuration registers 502, considering that other functional circuitry in PHY 106 as well as the supported communications links depend on state machine 700 operating in the intended state. Recovery from such a malfunction may be lengthy and cumbersome, if even possible, depending on the particular condition.

According to this example embodiment, the values of state variables 712 for state machine 700 are communicated to state variable encoder 714 for encoding according to a "one-hot" encoding. More specifically, state variable encoder 714 encodes the values of state variable 712 into a longer code word than is necessary to indicate the state of state machine 700, by creating a code word in which only one bit is a "1" value and all other bits are "0". In this encoding, each possible state of state machine 700 corresponds to one bit position of the code word, rather than each of state variables 712 corresponding to one bit position. In addition, the code word may be over-specified, with more bit positions than possible states. For this example of simple state machine 700 with two state variables 712 and three possible states, an example of the encoding generated by state variable encoder 714 according to this example embodiment is:

TABLE 2

| State | State code |
|---|---|
| BLOCK_RESET | 00001 |
| CLK_EN | 00100 |
| CLK_DIS | 10000 |

All other state codes are undefined.

The sparse one-hot encoding shown in this Table 2 improves the likelihood of detection of an SEU of one of the code word bits, as compared with the encoding of Table 1. For example, an SEU of either of the state variables 712 in the CLK_EN state encoded according to Table 1 would merely cause an unintended transition to either of the BLOCK_RESET or CLK_DIS states. The effect of this SEU could result in erroneous operation of PHY 106 in its communications operations, resulting in data loss or in other catastrophic results. In contrast, an SEU in a code word according to the encoding of Table 2 would appear as an invalid or undefined state (e.g., more than one "1" bit, or all "0" bits), and is readily detectable.

State variable encoder 714 is coupled to state register 720 in this example embodiment. State register 720 stores the code word encoded by state variable encoder 714 and is coupled to state register monitor logic 730. The bit storage locations of state register 720 may be constructed as memory cells, such as may be used in RAM and other register locations in PHY 106. Alternatively, the self-correcting TMR construction described relative to FIG. 5B for bit storage locations 520 in configuration registers 502 may also be applied to other storage locations in PHY 106, including one or more instances of state register 720.

In this example embodiment, state variable encoder 714 and state register 720 may be physically realized at or near the sequential logic implementing state machine 700, for example in its corresponding functional blocks such as management and PHY control circuitry 220 in the example of FIG. 7, while state register monitor logic 730 may be realized as part of state machine monitor 246 in in monitoring and detection circuitry 240, as suggested in FIG. 7. Alternatively, some or all of state variable encoder 714 and state register 720 may be physically realized separately from its state machine 700, for example in state machine monitor 246. State register monitor logic 730 has an output for presenting a reset or restart signal to the appropriate circuitry in PHY 106 in the event it detects an error in the operation of state machine 700. In this example, because state machine 700 is a reset control state machine in PHY 106, state register monitor logic 730 communicates the reset or restart signal to state machine 700 itself, via line RST/RESTRT shown in FIG. 7.

State register monitor logic 730 in this example also receives control information from state machine 700 on one or more signal lines XITION. As will be described below, the control information communicated by state machine 700 allows state register monitor logic 730 to monitor the validity of state transitions of state machine 700.

In operation, the cooperative combination of state variable encoder 714 and state register 720 with state register monitor logic 230 provides the ability to quickly detect and rapidly recover from an SEU in the sequential logic of PHY 106, as will now be described with reference to FIG. 8 for the example of reset control state machine 700. In process 800, state machine 700 is instantiated to begin its operation, for example upon its receipt of either a main reset of PHY 106 or a restart signal ("main_reset|restart"). Once instantiated, state machine 700 will transition among its available states 702, 704, 706 as described above.

As state machine 700 operates in this manner, the values of its state variables (e.g., block_reset and block_clk_en) are encoded by state variable encoder 714 in process 802 into a code word for storage in state register 720. As described above, the encoding applied by state variable encoder 714 is one-hot encoding such that only one bit position in state register 720 (e.g., the bit position corresponding to the current state) is a "1" and all other bit positions are "0". Further, the code word generated by state variable encoder 714 may be over-specified, such that state register 720 for state register 700 has a width greater than the number of valid states. Such encoding continues throughout the operation of the instantiated state machine 700.

Figure 8:
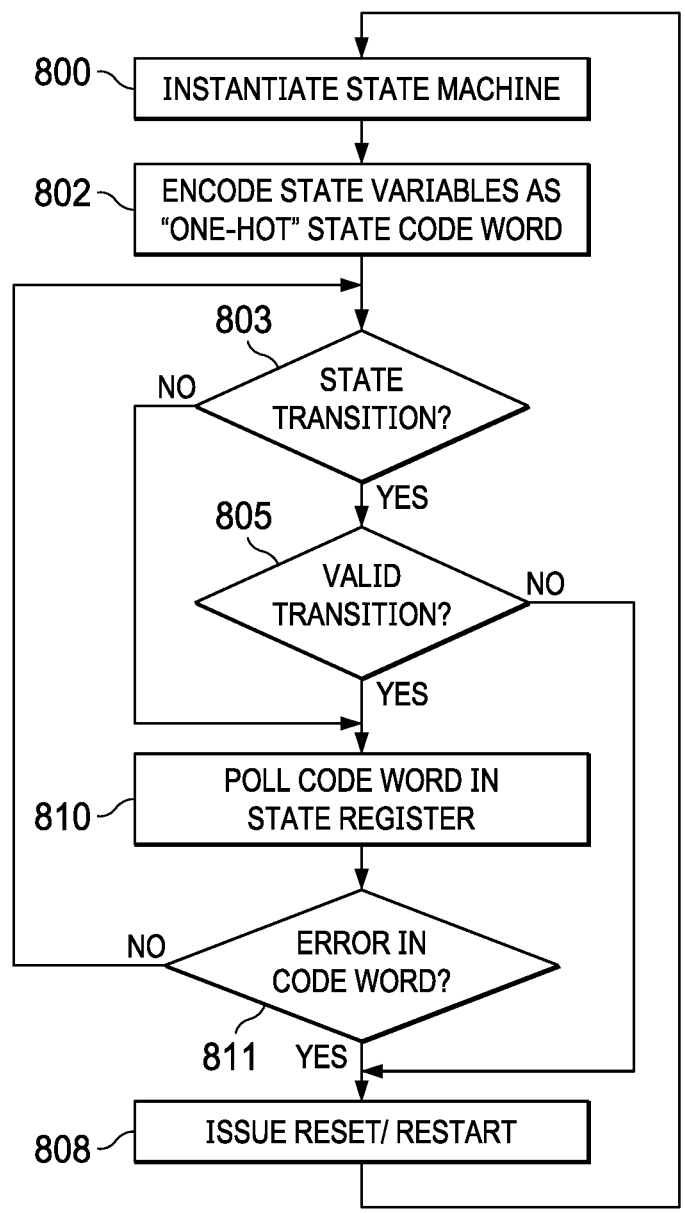
FIG. 8 is a flow diagram illustrating the operation of the state machine monitor of FIG. 7 according to an example embodiment.

According to the example embodiments of FIG. 7 and FIG. 8, state register monitor logic 730 receives control information from state machine 700 via control lines XITION, and analyzes each state transition of state machine 700 to detect transition errors, such as may occur from an SEE. In this example, state register monitor logic 730 executes decision 803 to detect the occurrence of a state transition of state machine 700. In the event of a state transition (decision 803 is "yes"), state register monitor logic 730 compares state information (e.g., values of the state variables) from the previous state of state machine 700 with state information in the new state to determine whether the transition from the previous state to the new state is valid. The comparison of previous state information to new state information may be performed by state register monitor logic 730 by comparing the encoded code words in state register 720 for the two states in decision 805. For the example of state machine 700 in FIG. 7, the only valid transition from state 704 is to state 702, and the only valid transition from state 706 is to state 702. Accordingly, in the event that an SEE causes an apparent transition from state 704 directly to state 706 (decision 805 is "no"), state register monitor logic 730 detects this invalid transition and in process 808 issues a reset or restart signal to state machine 700 on line RST/RESTRT. In this example, re-instantiation of state machine is performed in process 800 as appropriate.

If no state transition is detected (decision 803 is "no") or if the detected state transition is a valid transition (decision 805 is "no"), state register monitor logic 730 operates in process 810 to poll the code word in state register 720 in process 810 and determines whether its contents are valid in decision 811. Because of the sparse one-hot encoding of the code word stored by state register 720, state register monitor logic 730 can easily detect in decision 811 whether an SEU has flipped the state of one of the bits of state register 720, for example by detecting two bits with a "1" state or detecting that all bits of state register 720 are "0", either of which indicates an invalid state. If such an error is detected in the contents of state register 720 (decision 811 is "yes"), state register monitor logic 730 issues a reset or restart signal to state machine 700 on line RST/RESTRT in process 808.

If the contents of state machine 720 read in polling process 810 are valid (decision 811 is "no"), state register monitor logic 730 continues to monitor the operation of state machine 720 for state transitions (decision 803), and also periodically polls state register 720 to check the validity of its contents (decision 811), during the operation of state machine 700.

According to this example embodiment, therefore, the sparse one-hot encoding of the values of state variables 712 for storing in state register 720 enhances the probability that state register monitor logic 730 can detect an SEE if one occurs at state register 720. In addition, the monitoring of state transitions by state register monitor logic 730 enables early detection of invalid or unintentional state transitions, such as may be caused by SEEs. The combination of these two approaches enables monitoring and detection circuitry 240 in PHY 106 to initiate the appropriate corrective action in a timely manner, thus avoiding catastrophic errors in the communications link supported by PHY 106 in its network application.

Figure 9A:
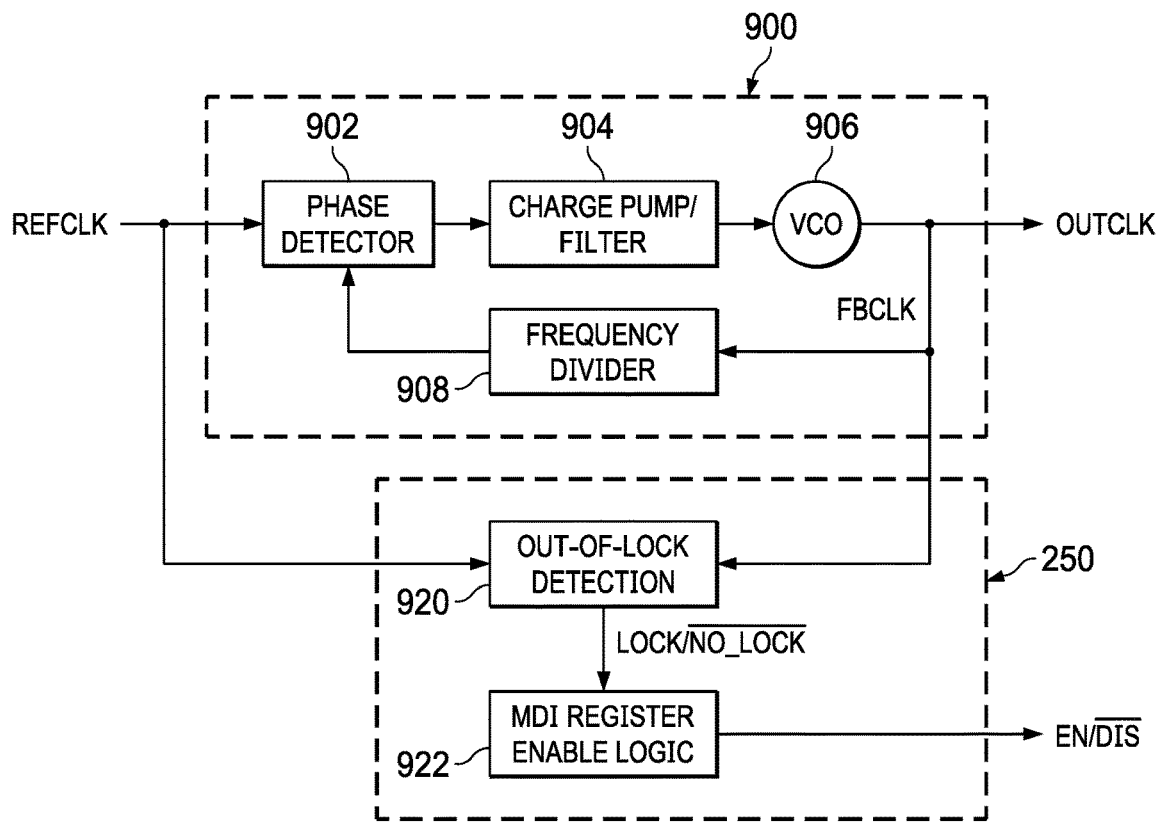
FIG. 9A is an electrical diagram, in block form, of a PLL and out-of-lock detection circuitry in the PHY of FIG. 2 according to an example embodiment.
Figure 9B:
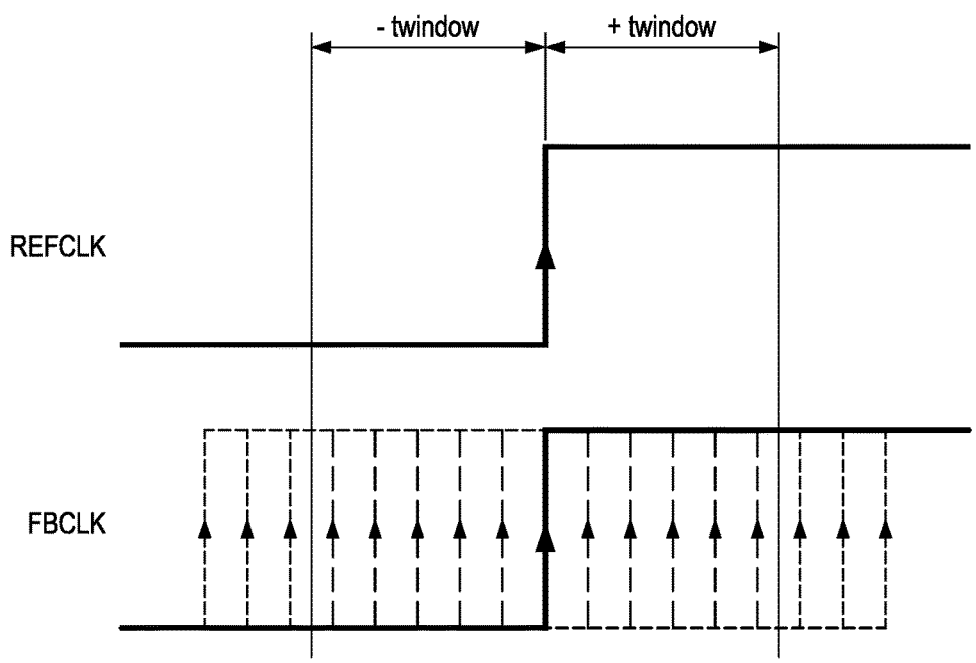
FIG. 9B is a timing diagram illustrating a timing window as used in the detection of phase lock and out-of-lock by the out-of-lock detection circuitry of FIG. 9A according to an example embodiment.
Figure 10:
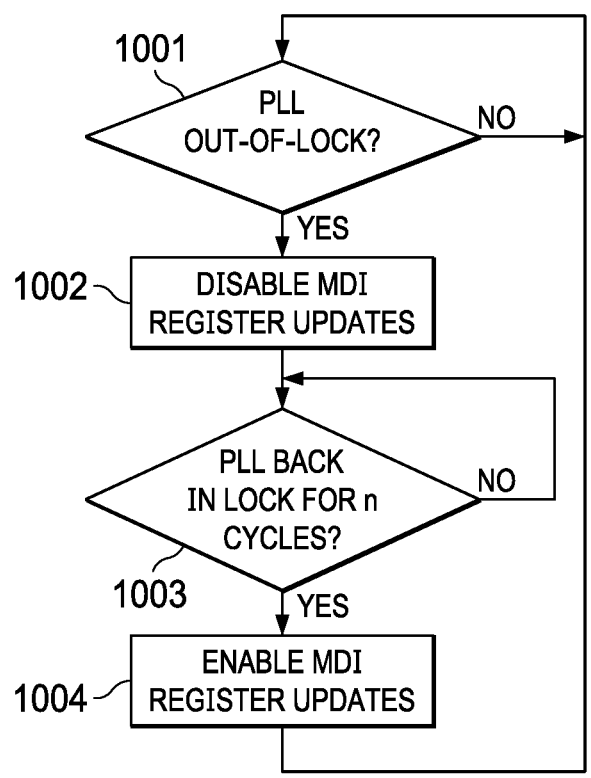
FIG. 10 is a flow diagram illustrating the operation of the PLL lock detection circuitry of FIGS. 9A and 9B according to an example embodiment.

Referring to FIGS. 9A, 9B, and 10, the construction and operation of PLL lock monitor 250 as deployed within converter block 210 according to an example embodiment will be described. As shown in FIG. 2, converter block 210 in this example embodiment includes timing circuitry 218 configured to generate various internal clocks based on a master clock signal received from a source external to PHY 106 or generated within PHY 106. These internal clocks generated by timing circuitry 218 include the appropriate clock signals suitable for transmitting and receiving data signals over media dependent interface (MDI) 122. A common circuit for generating such a clock signal for data transmission over MDI 122 is a phase-locked loop (PLL), an example of which is illustrated in FIG. 9A as PLL 900.

By way of example, PLL 900 of FIG. 9A is constructed in a typical configuration including phase detector 902 having one input coupled to receive a reference clock signal REFCLK, as may generated by a clock reference circuit (not shown) in timing circuitry 218 or elsewhere in PHY 106. Phase detector 902 operates to compare the phase of reference clock signal REFCLK with a feedback signal received at another input, and forwards a signal from its output to charge pump and filter circuitry 904 corresponding to that phase difference. Charge pump and filter circuitry 904 generates a voltage level in response to the phase difference signal from phase detector 902 and according to the desired loop filter characteristic, and applies that voltage level to a control input of voltage controlled oscillator (VCO) 906. VCO 906 generates an output clock signal OUTCLK at a frequency corresponding to the voltage level at its input from charge pump and filter circuitry 904. Output clock signal OUTCLK may serve as the clock used to synchronize data transfer over MDI 122 in this example embodiment.

Output clock signal OUTCLK also serves as (or is the basis for) feedback clock signal FBCLK. In this example embodiment, output clock signal OUTCLK is at a higher frequency than reference clock signal REFCLK applied to phase detector 902. As such, frequency divider 908 divides down the frequency of feedback clock signal FBCLK and applies that divided-down feedback clock to phase detector 902 for comparison with reference clock REFCLK.

As noted above, phase locked loop (PLL) lock monitor 250 is provided to detect timing upset in DAC/ADC subsystem 214 that may occur from an SEE, thus monitoring the integrity of the data path in PHY 106 when deployed in environments conducive to SEEs. For example, an SEE impinging timing circuitry 218 may cause PLL 900 to lose phase lock. As such, in this example embodiment, the instance of PLL lock monitor 250 operates to monitor the operation of PLL 900 to detect an out-of-lock condition. As shown in FIG. 9A, out-of-lock detection circuit 920 has an input receiving reference clock REFCLK and an input receiving feedback clock FBCLK (which is output clock signal OUTCLK in this example). Out-of-lock detection circuit 920 compares the phase of reference clock REFCLK with the pulses of feedback clock FBCLK to determine whether PLL 900 is in phase lock, and issues signal on line LOCK/$\overline{\text{NO\_LOCK}}$ to MDI register enable logic 922 at a logic level indicating the result. Out-of-lock detection circuit 920 may be constructed according to any one of a number of known circuits having this function.

Feedback clock signal FBCLK in this example, which is generated by VCO 906, is at a higher frequency than reference clock REFCLK. Because of this higher frequency of feedback clock signal FBCLK, out-of-lock detection circuit 920 determines whether PLL 900 is in phase lock by measuring the phase of reference clock REFCLK relative to a "window" of pulses of feedback clock signal FBCLK. FIG. 9B illustrates an example of the comparison performed by an example of out-of-lock detection circuit 920. As shown in FIG. 9B, a timing window±twindow is defined to extend for five periods of feedback clock FBCLK on either side of a central pulse at which reference clock REFCLK is aligned in phase lock. If the rising edge of reference clock REFCLK occurs outside of timing window±twindow, out-of-lock detection circuit 920 will issue a low logic level on signal line LOCK/$\overline{\text{NO\_LOCK}}$ to MDI register enable logic 922; conversely, a rising edge of reference clock REFCLK within the timing window timing window ±twindow causes out-of-lock detection circuit 920 to issue a high logic level on signal line LOCK/$\overline{\text{NO\_LOCK}}$, indicating a phase lock condition. By providing a timing window ±twindow as shown in FIG. 9B, out-of-lock detection 920 distinguishes an upset due to an SEE, which likely causes a severe phase misalignment at PLL 900, from jitter or other minor variations in clock phase as encountered in normal PLL operation.

MDI register enable logic 922 responds to a high logic level on line LOCK/$\overline{\text{NO\_LOCK}}$, indicating phase lock, by asserting a high logic level at its output on line EN/$\overline{\text{DIS}}$ to enable register updates, by way of which data transfer over MDI interface 122 is effected. Conversely, in response to a low logic level on line LOCK/$\overline{\text{NO\_LOCK}}$, indicating loss of phase lock, MDI register enable logic 922 disables MDI register updates by asserting a low logic level at its output on line EN/$\overline{\text{DIS}}$.

FIG. 10 illustrates a generalized method of monitoring the data path of PHY 106 for errors caused by SEEs and of responding accordingly. The method of FIG. 10 begins in normal operation of the data path, with PLL 900 in phase lock and thus generating its output clock signal OUTCLK at a stable phase and frequency, and MDI register updates being enabled. During this time, monitoring of phase lock is performed by out-of-lock detection circuit 920. So long as PLL 900 remains in phase lock within the limits of timing window ±twindow as shown in FIG. 9B (decision 1001 is "no"), MDI register updates remain enabled.

However, upon out-of-lock detection circuit 920 detecting that PLL is out of phase lock (decision 1001 is "yes") and notifying MDI register enable logic 922 accordingly, MDI register enable logic 922 disables further MDI register updates by issuing a low logic level on signal line EN/$\overline{\text{DIS}}$ in process 1002. MDI register updates remain disabled by MDI register enable logic 922 until PLL 900 regains phase lock. In this example, the phase lock condition must extend for a number n cycles of reference clock REFCLK, where n>1. For example, n=5 cycles of reference clock REFCLK with PLL 900 in phase lock may be required to re-enable MDI register updates. Until that time (decision 1003 is "no"), MDI register updates are disabled, blocking the data flow over MDI interface 122 of PHY 106. Once phase lock is attained for n cycles (decision 1003 is "yes"), MDI register enable logic 922 again enables MDI register updates in process 1004, and PLL 900 continues operation with monitoring by out-of-lock detection circuitry 920 as described above.

According to the example embodiments described herein, an architecture for a PHY transceiver device that is particularly suitable for harsh environments from an SEE standpoint, such as in the space environment, is provided. The PHY device according to these example embodiments provide robust detection of SEEs and rapid response to those events, in some cases without requiring a full reset of the PHY device, but in any case without necessitating failure of a communications link in order to effect the necessary reset and reboot. Errors in communication can thus be reduced.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While certain elements of some embodiments are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A physical layer transceiver comprising:
a media independent interface;
a converter circuit block comprising circuitry configured to convert digital signals to analog signals for transmission over a network communications medium, and to convert analog signals received over the network communications medium to digital signals;
at least one processing block coupled to the converter circuit block and comprising circuitry configured to process data communicated between the media independent interface and the converter circuit block according to a network protocol;
management and control circuitry, coupled to the at least one processing block, and comprising power management circuitry and reset circuitry for the physical layer transceiver; and
at least one single event effect (SEE) monitor configured to detect and respond to an SEE effect, wherein the SEE monitor includes an ambience monitor, the SEE monitor is configured to:
sample and digitize a value of one or more of a power supply voltage or one or more of a power supply current applied to the transceiver, to generate a digital value; and
compare the digital value with previous digital values of the one or more power supply voltage and one or more power supply current.

2. The transceiver of claim 1, wherein the at least one SEE monitor is selected from a group including the ambience monitor coupled to the management and control circuitry, a register monitor coupled to at least one configuration register in one of the processing blocks, a state machine monitor coupled to sequential logic in one of the processing blocks or in the management and control circuitry, and a phase locked loop (PLL) out-of-lock monitor coupled to the converter circuit block.

3. The transceiver of claim 2, wherein the at least one SEE monitor comprises the ambience monitor;
and wherein the ambience monitor comprises:
modulation circuitry configured to sample a first value of one or more of a power supply voltage or a power supply current applied to the transceiver, and to digitize the sampled first value to produce a first digital value;
a history memory, coupled to the modulation circuitry, for storing the first digital value along with previous digital values of the one or more power supply voltage and power supply current; and
a single event functional interrupt (SEFI) engine coupled to the modulation circuitry and the history memory, the SEFI engine configured to determine whether the first digital value differs from previous digital values of the one or more power supply voltage and power supply current by more than a threshold and, in response to the first digital value differing from previous digital values by more than the threshold, to issue a reset signal to the management and control circuitry.

4. The transceiver of claim 3, wherein the SEFI engine is further configured to update the threshold according to the first digital value in response to the first digital value not differing from previous digital values by more than the threshold.

5. The transceiver of claim 3, further comprising:
a plurality of power supply terminals, each for receiving a power supply voltage; and
a plurality of supply current sensors, each supply current sensor coupled to sense a power supply current from one of the plurality of power supply voltages;
and wherein the modulation circuitry comprises:
a multiplexer having a plurality of inputs, each of the plurality of inputs coupled to one of the power supply terminals or to one of the plurality of supply current sensors, and having a select input receiving a select signal;
a modulator configured to sample an analog signal at an output of the multiplexer and digitize the sampled analog signal;

a decimation filter configured to filter the digitized analog signal to produce the digital value to the history memory and the SEFI engine.

6. The transceiver of claim 5, further comprising:
a device temperature sensor;
wherein the multiplexer also has an input coupled to the device temperature sensor;
wherein the modulation circuitry samples and digitizes an analog signal from the device temperature sensor to produce a digital value for device temperature;
and wherein the SEFI engine is further configured to determine whether the digital value for device temperature differs from previous digital values for device temperature by more than a threshold and, in response to the digital value for device temperature differing from previous digital values by more than the threshold, to issue a reset signal to the management and control circuitry.

7. The transceiver of claim 2, wherein the at least one SEE monitor comprises the register monitor;
and wherein the register monitor comprises error correcting code (ECC) circuitry coupled to a configuration register in one of the at least one processing blocks, the ECC circuitry configured to read a code word from the configuration register and determine, according to an ECC code, whether the code word read from the configuration register contains an errored bit.

8. The transceiver of claim 7, wherein the ECC circuitry is configured, according to the ECC code, to reload the configuration register with a corrected code word in response to detecting a number of errored bits in the code word up to a correction limit;
and wherein the ECC circuitry is further configured, according to the ECC code, to issue a reset in response to detecting a number of errored bits in the code word greater than the correction limit.

9. The transceiver of claim 2, wherein the at least one SEE monitor comprises the state machine monitor;
wherein at least one of the at least one processing block and management and control circuitry comprises sequential logic corresponding to a state machine having one or more states and one or more state variables;
further comprising:
a state register for storing a state code corresponding to a current state of the state machine; and
a state variable encoder configured to encode values of the state variables into a one-hot encoding for storing as the state code for the current state of the state machine;
and wherein the state machine monitor comprises:
state register monitor logic, coupled to the state register and to the state machine, and configured to:
determine, responsive to a state transition of the state machine, whether the state transition is valid;
periodically poll the state register to determine whether the stored state code is valid; and
responsive to either detecting an invalid state transition or an invalid state code, issue a reset signal to reset circuitry in the transceiver.

10. The transceiver of claim 2, wherein the at least one SEE monitor comprises the PLL out-of-lock monitor;
and wherein the PLL out-of-lock monitor is configured to:
detect whether a reference clock applied to an input of a phase-locked-loop is out of phase relative to a feedback clock outside of a timing window; and
responsive to detecting that the phase-locked-loop is out of phase relative to the feedback clock outside of the timing window, disabling register updates at an interface of the transceiver.

11. A network node, comprising:
a network node processor;
a media access control coupled to the network node processor;
a physical layer transceiver comprising:
a media independent interface coupled to the media access control;
a media dependent interface adapted to couple to a network communications medium;
a converter circuit block coupled to the media dependent interface and comprising circuitry configured to convert digital signals to analog signals for transmission over the network communications medium, and to convert analog signals received over the network communications medium to digital signals;
at least one processing block coupled to the converter circuit block comprising circuitry configured to process data communicated between the media independent interface and the converter circuit block according to a network protocol;
management and control circuitry, coupled to the at least one processing block, and comprising power management circuitry and reset circuitry for the physical layer transceiver; and
at least one single event effect (SEE) monitor configured to detect and respond to an SEE effect, wherein the SEE monitor includes an ambience monitor, the SEE monitor is configured to:
sample and digitize a value of one or more of a power supply voltage or one or more of a power supply current applied to the transceiver, to generate a digital value; and
compare the digital value with previous digital values of the one or more power supply voltage and one or more power supply current.

12. The network node of claim 11, wherein the at least one SEE monitor is selected from a group including the ambience monitor coupled to the management and control circuitry, a register monitor coupled to at least one configuration register in one of the processing blocks, a state machine monitor coupled to sequential logic in one of the processing blocks or in the management and control circuitry, and a phase locked loop (PLL) out-of-lock monitor coupled to the converter circuit block.

13. The network node of claim 12, wherein the at least one SEE monitor comprises the ambience monitor;
and wherein the ambience monitor comprises:
modulation circuitry configured to sample a first value of one or more of a power supply voltage or a power supply current applied to the transceiver, and to digitize the sampled first value to produce a first digital value;
a history memory, coupled to the modulation circuitry, for storing the first digital value along with previous digital values of the one or more power supply voltage and power supply current; and
a single event functional interrupt (SEFI) engine coupled to the modulation circuitry and the history memory, the SEFI engine configured to determine whether the first digital value differs from previous digital values of the one or more power supply voltage and power supply current by more than a threshold and, in response to the first digital value differing from previous digital values by more than the threshold, to issue a reset signal to the management and control circuitry.

14. The network node of claim 13, wherein the SEFI engine is further configured to update the threshold according to the first digital value in response to the first digital value not differing from previous digital values by more than the threshold.

15. The network node of claim 13, further comprising:
a plurality of power supply terminals, each for receiving a power supply voltage; and
a plurality of supply current sensors, each supply current sensor coupled to sense a power supply current from one of the plurality of power supply voltages;
and wherein the modulation circuitry comprises:
a multiplexer having a plurality of inputs, each of the plurality of inputs coupled to one of the power supply terminals or to one of the plurality of supply current sensors, and having a select input receiving a select signal;
a modulator configured to sample an analog signal at an output of the multiplexer and digitize the sampled analog signal;
a decimation filter configured to filter the digitized analog signal to produce the digital value to the history memory and the SEFI engine.

16. The network node of claim 15, further comprising:
a device temperature sensor;
wherein the multiplexer also has an input coupled to the device temperature sensor;
wherein the modulation circuitry samples and digitizes an analog signal from the device temperature sensor to produce a digital value for device temperature;
and wherein the SEFI engine is further configured to determine whether the digital value for device temperature differs from previous digital values for device temperature by more than a threshold and, in response to the digital value for device temperature differing from previous digital values by more than the threshold, to issue a reset signal to the management and control circuitry.

17. The network node of claim 12, wherein the at least one SEE monitor comprises the register monitor;
and wherein the register monitor comprises error correcting code (ECC) circuitry coupled to a configuration register in one of the at least one processing blocks, the ECC circuitry configured to read a code word from the configuration register and determine, according to an ECC code, whether the code word read from the configuration register contains an errored bit.

18. The network node of claim 17, wherein the ECC circuitry is configured, according to the ECC code, to reload the configuration register with a corrected code word in response to detecting a number of errored bits in the code word up to a correction limit;
and wherein the ECC circuitry is further configured, according to the ECC code, to issue a reset in response to detecting a number of errored bits in the code word greater than the correction limit.

19. The network node of claim 12, wherein the at least one SEE monitor comprises the state machine monitor;
wherein at least one of the at least one processing block and management and control circuitry comprises sequential logic corresponding to a state machine having one or more states and one or more state variables;
further comprising:
a state register for storing a state code corresponding to a current state of the state machine; and
a state variable encoder configured to encode values of the state variables into a one-hot encoding for storing as the state code for the current state of the state machine;
and wherein the state machine monitor comprises:
state register monitor logic, coupled to the state register and to the state machine, and configured to:
determine, responsive to a state transition of the state machine, whether the state transition is valid;
periodically poll the state register to determine whether the stored state code is valid; and
responsive to either detecting an invalid state transition or an invalid state code, issue a reset signal to reset circuitry in the transceiver.

20. The network node of claim 12, wherein the at least one SEE monitor comprises the PLL out-of-lock monitor;
and wherein the PLL out-of-lock monitor is configured to:
detect whether a reference clock applied to an input of a phase-locked-loop is out of phase relative to a feedback clock outside of a timing window; and
responsive to detecting that the phase-locked-loop is out of phase relative to the feedback clock outside of the timing window, disabling register updates at the media dependent interface.

21. A method, comprising:
operating a processing block in a physical layer transceiver in a network node processor to process data communicated at a media independent interface of the physical layer transceiver;
converting digital signals from the processing block to analog signals for transmission over a media dependent interface adapted to couple to a network communications medium, and converting analog signals received over the network communications medium to digital signals;
detecting a single event effect (SEE) by an SEE monitor occurring in the physical layer transceiver, the SEE monitor selected from a group including an ambience monitor, a register monitor, a state machine monitor and a phase locked loop (PLL) out-of-lock monitor; and
responsive to the detection of an SEE, resetting the physical layer transceiver wherein the SEE monitor includes the ambience monitor, the SEE monitor configured to:
sampling and digitizing a value of one or more of a power supply voltage or one or more of a power supply current applied to the physical layer transceiver, to generate a digital value; and
comparing the digital value with previous digital values of the one or more power supply voltage and one or more power supply current.

22. The method of claim 21, wherein the step of detecting an SEE comprises:
sampling and digitizing a first value of one or more of a power supply voltage or a power supply current applied to the transceiver, to produce a first digital value;
storing, in a history memory, the first digital value along with previous digital values of the one or more power supply voltage and power supply current;
determining whether the first digital value differs from previous digital values of the one or more power supply voltage and power supply current by more than a threshold; and
in response to the first digital value differing from previous digital values by more than the threshold, issuing a reset signal to reset circuitry in the transceiver.

23. The method of claim 21, wherein the step of detecting an SEE comprises:
  monitoring the contents of a configuration register associated with the processing block by reading an error correcting code (ECC) code word stored in the configuration register;
  determining whether the code word read from the configuration register contains one or more errored bits;
  responsive to determining that the code word read from the configuration register contains a number of errored bits in the code word up to a correction limit, reloading the configuration register with a corrected code word; and
  responsive to determining that the code word read from the configuration register contains a number of errored bits in the code word greater than the correction limit, issuing a reset signal to reset circuitry in the transceiver.

24. The method of claim 21, wherein the step of detecting an SEE comprises:
  monitoring a state machine in the processing block or in management and control circuitry of the transceiver, the state machine operable in one or more states and according to one or more state variables, the state machine comprising a state register for storing a state code corresponding to a current state of the state machine, by:
    responsive to a state transition of the state machine, determining whether the state transition is valid;
    periodically polling the state register to determine whether the stored state code is valid; and
    responsive to either detecting an invalid state transition or an invalid state code, issue a reset signal to reset circuitry in the transceiver.

25. The method of claim 21, wherein the step of detecting an SEE comprises:
  detect whether a reference clock applied to an input of a phase-locked-loop in circuitry performing the converting step is out of phase relative to a feedback clock outside of a timing window; and
  responsive to detecting that the phase-locked-loop is out of phase relative to the feedback clock outside of the timing window, disabling register updates at the media dependent interface.

* * * * *